United States Patent
Jikutani et al.

(10) Patent No.: US 8,594,146 B2
(45) Date of Patent: Nov. 26, 2013

(54) SURFACE EMITTING LASER ELEMENT, SURFACE EMITTING LASER ARRAY, OPTICAL SCANNING DEVICE, AND IMAGE FORMING APPARATUS

(75) Inventors: Naoto Jikutani, Miyagi (JP); Satoru Sugawara, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 189 days.

(21) Appl. No.: 12/865,951

(22) PCT Filed: Feb. 9, 2009

(86) PCT No.: PCT/JP2009/052457
§ 371 (c)(1),
(2), (4) Date: Aug. 3, 2010

(87) PCT Pub. No.: WO2009/102048
PCT Pub. Date: Aug. 20, 2009

(65) Prior Publication Data
US 2010/0328747 A1    Dec. 30, 2010

(30) Foreign Application Priority Data

| | | |
|---|---|---|
| Feb. 12, 2008 | (JP) | 2008-029877 |
| Apr. 23, 2008 | (JP) | 2008-112494 |
| May 27, 2008 | (JP) | 2008-138419 |
| Nov. 7, 2008 | (JP) | 2008-287101 |
| Nov. 7, 2008 | (JP) | 2008-287123 |

(51) Int. Cl.
*H01S 5/00* (2006.01)

(52) U.S. Cl.
USPC ............. 372/50.124; 372/45.01; 372/46.01; 372/50.11

(58) Field of Classification Search
USPC .............. 372/45.01, 46.01, 50.11, 50.124
See application file for complete search history.

(56) References Cited

U.S. PATENT DOCUMENTS

| 5,253,264 A | 10/1993 | Suzuki et al. |
|---|---|---|
| 6,614,821 B1 | 9/2003 | Jikutani et al. |

(Continued)

FOREIGN PATENT DOCUMENTS

| JP | 11-48520 | 2/1999 |
|---|---|---|
| JP | 2000-22204 | 1/2000 |

(Continued)

OTHER PUBLICATIONS

Choquette, K.D. et al. (1994), "Low Threshold Voltage Vertical-Cavity Lasers Fabricated by Selective Oxidation", Electronic Letters, No. 24, vol. 30, pp. 2043-2044.

(Continued)

*Primary Examiner* — Yuanda Zhang
(74) *Attorney, Agent, or Firm* — Cooper & Dunham LLP

(57) ABSTRACT

A surface emitting laser element is disclosed. The surface emitting laser element includes a resonator structural body including an active layer, first and second semiconductor distributed Bragg reflectors which sandwich the resonator structural body, and a confinement structure which can confine an injection current and a lateral mode of oscillation light at the same time by being formed with selective oxidation of a layer to be selectively oxidized containing aluminum in the first semiconductor distributed Bragg reflector. A thickness of the layer to be selectively oxidized is 28 nm, and a temperature when an oscillation threshold current becomes a minimum value is approximately 17° C.

17 Claims, 25 Drawing Sheets

(56) References Cited

U.S. PATENT DOCUMENTS

| | | | |
|---|---|---|---|
| 6,674,785 | B2 | 1/2004 | Sato et al. |
| 6,711,198 | B1 | 3/2004 | Ichihara et al. |
| 6,765,232 | B2 | 7/2004 | Kaminishi et al. |
| 6,803,604 | B2 | 10/2004 | Takahashi et al. |
| 6,927,412 | B2 | 8/2005 | Takahashi et al. |
| 6,959,025 | B2 | 10/2005 | Jikutani et al. |
| 7,466,738 | B2 | 12/2008 | Jikutani |
| 7,542,499 | B2 | 6/2009 | Jikutani |
| 7,684,458 | B2 | 3/2010 | Sato et al. |
| 7,693,204 | B2 | 4/2010 | Sato et al. |
| 7,746,912 | B2 | 6/2010 | Motomura et al. |
| 2001/0050935 | A1 | 12/2001 | Yokouchi |
| 2002/0071464 | A1* | 6/2002 | Coldren et al. .......... 372/45 |
| 2004/0091011 | A1 | 5/2004 | Liu |
| 2006/0093010 | A1* | 5/2006 | Sekiya et al. ............ 372/99 |
| 2008/0024849 | A1 | 1/2008 | Hayashi et al. |
| 2008/0043796 | A1 | 2/2008 | Jikutani et al. |
| 2008/0055672 | A1 | 3/2008 | Watanabe et al. |
| 2008/0233017 | A1 | 9/2008 | Sato et al. |
| 2009/0022199 | A1 | 1/2009 | Jikutani et al. |
| 2009/0262770 | A1 | 10/2009 | Itoh et al. |
| 2009/0295902 | A1 | 12/2009 | Sato et al. |
| 2010/0060712 | A1 | 3/2010 | Sato et al. |

FOREIGN PATENT DOCUMENTS

| | | |
|---|---|---|
| JP | 2001-332812 | 11/2001 |
| JP | 2003-133639 | 5/2003 |
| JP | 2003-198061 | 7/2003 |
| JP | 2004-31925 | 1/2004 |
| JP | 2004-128524 | 4/2004 |
| JP | 2004-319643 | 11/2004 |
| JP | 2005-340779 | 12/2005 |
| JP | 2009-283888 | 12/2009 |
| WO | WO2007/063806 | 6/2007 |

OTHER PUBLICATIONS

Choquette, K.D. et al. (1995), "Cavity Characteristics of Selectively Oxidized Vertical-Cavity Lasers", Applied Physics Letters, vol. 66, No. 25, pp. 3413-3415.

Nakayama, H. et al. (2004), "780 nm VCSELs for Home Networks and Printers", Electronic Components and Technology Conference Proceedings, 54th, vol. 2, pp. 1371-1375.

Japanese official action dated Jan. 17, 2013 in corresponding Japanese patent application No. 2008-287101.

* cited by examiner

| | REFRACTIVE INDEX |
|---|---|
| $Al_{0.3}Ga_{0.7}As$ | 3.4924 |
| $Al_{0.9}Ga_{0.1}As$ | 3.0901 |
| AlAs | 3.0179 |
| GaAs | 3.6771 |
| $AlO_x$ | 1.6 |

| THICKNESS OF LAYER TO BE SELECTIVELY OXIDIZED [nm] | OXIDE CONFINEMENT DIAMETER [μm] | | | |
|---|---|---|---|---|
| | 3.5 | 4.0 | 4.5 | 5.0 |
| 20 | 0.707 | 0.788 | 0.846 | 0.891 |
| 25 | 0.871 | 0.921 | 0.949 | 0.967 |
| 28 | 0.930 | 0.959 | 0.974 | 0.984 |
| 30 | 0.953 | 0.973 | 0.983 | 0.989 |

| THICKNESS OF LAYER TO BE SELECTIVELY OXIDIZED [nm] | OXIDE CONFINEMENT DIAMETER [μm] | | | |
|---|---|---|---|---|
| | 3.5 | 4.0 | 4.5 | 5.0 |
| 20 | × | × | × | × |
| 25 | × | ○ | ○ | ○ |
| 28 | ○ | ○ | ○ | ○ |
| 30 | ○ | ○ | ○ | ○ |

SURFACE EMITTING LASER ELEMENT, SURFACE EMITTING LASER ARRAY, OPTICAL SCANNING DEVICE, AND IMAGE FORMING APPARATUS

TECHNICAL FIELD

The present invention generally relates to a surface emitting laser element which emits laser beams in a direction perpendicular to a surface of a substrate of the light emitting laser element, a surface emitting laser array in which the surface emitting laser elements are arrayed, an optical scanning device using the surface emitting laser element or the surface emitting laser array, and an image forming apparatus using the optical scanning device.

BACKGROUND ART

Recently, a surface emitting laser element (surface emitting semiconductor laser element) which emits laser beams in a direction perpendicular to a surface of a substrate of the surface emitting laser element has been greatly researched. In the surface emitting laser element, an oscillation threshold current is lower than that of an edge emitting laser element, and a high-quality circle-shaped laser beam can be obtained. In addition, since the surface emitting laser element can emit a laser beam in a direction perpendicular to a substrate of the surface emitting laser element, the surface emitting laser elements can be two-dimensionally arrayed with high density. Therefore, applications to, for example, a light source for interconnecting parallel light and a high-speed electrophotographic system having high definition have been studied.

In order to increase current injection efficiency, the surface emitting laser element has a confinement structure. As the confinement structure, a confinement structure in which Al (aluminum) is selectively oxidized is frequently used. Hereinafter, in some cases, this confinement structure is refereed to as an oxide confinement structure (see Non-Patent Documents 1 and 2).

In addition, in Non-Patent Document 3, a printer using a VCSEL (vertical cavity surface emitting laser) array (surface emitting laser array) of a 780 nm band is described.

In addition, Patent Document 1 discloses a surface emitting laser element. In the surface emitting laser element, a difference (detuning amount) between an oscillation wavelength determined by the length of a resonator and a gain peak wavelength determined by the composition of an active layer is a predetermined amount at a predetermined temperature, and the oscillation wavelength becomes equal to the gain peak wavelength at a temperature range higher than the predetermined temperature.

In addition, Patent Document 2 discloses a multi-spot image forming apparatus having a multi-spot light source.

[Patent Document 1] Japanese Unexamined Patent Publication No. 2004-319643

[Patent Document 2] Japanese Unexamined Patent Publication No. H11-48520

[Non-Patent Document 1] K. D. Choquette, K. L. Lear, R. P. Schneider, Jr., and K. M. Geib, "Cavity Characteristics of Selectively Oxidized Vertical-Cavity Lasers", Applied Physics Letters, vol. 66, No. 25, pp. 3413-3415, 1995

[Non-Patent Document 2] K. D. Choquette, R. P. Schneider, Jr., K. L. Lear, and K. M. Geib, "Low Threshold Voltage Vertical-Cavity Lasers Fabricated by Selective Oxidation", Electronic Letters, No. 24, vol. 30, pp. 2043-2044, 1994

[Non-Patent Document 3] H. Nakayama, T. Nakamura, M. Funada, Y. Ohashi, and M. Kato, "780 nm VCSELs for Home Networks and Printers" Electronic Components and Technology Conference Proceedings, 54th, vol. 2, June 2004, pp. 1371-1375

In electrophotography, a rise movement of a response pulse shape of light output from a light source greatly influences image quality when a driving current is supplied to the light source. The response pulse shape is a change of the light output with the passage of time, and in some cases is referred to as a light pulse shape. For example, not only at a rise time of the light pulse shape but after the light output reaches a constant amount at the initial rise time, even if the light amount is slightly changed, there is a risk that the image quality may be lowered.

It is a contour part of an image that is formed at a rise time and a fall time of the light pulse shape, and in particular at the rise time and for a few moments after that is regarded as approximately risen; when the light amount is changed, the contour part of the image becomes unclear and image quality becomes visually indistinct.

For example, when a time required to scan one line of approximately 300 mm width of A4 (297 mm×210 mm) size paper is 300 μs, a width of approximately 1 mm is scanned in 1 μs. It is said that a width of 1 to 2 mm is visually perceived highest by a person when image density is changed. Therefore, when the image density is changed in the width of approximately 1 mm, the image density change is sufficiently detected by the person and the image gives the person an impression that the contour of the image is indistinct.

FIG. 39 is a graph showing a light pulse shape of a conventional surface emitting laser element. In FIG. 39, a surface emitting laser element having an oxide confinement structure is driven by pulse conditions in which the pulse width is 500 μs and the duty ratio is 50% (pulse period is 1 ms). As shown in FIG. 39, when viewed from a relatively long time scale, the light output shows a peak right after the rise, and is lowered and becomes stable. The change of the light output is caused by self-heating of the surface emitting laser element and is called "droop characteristics".

FIG. 40 is an enlarged view of the rise part of the light output shown in FIG. 39. The inventors of the present invention have studied the light output in detail. As shown in FIG. 40, when viewed from a short time scale, the inventors have found generation of a change of the light output different from the droop characteristics.

In FIG. 40, the light output has not become a risen state even when 10 ns has passed, becomes an approximately risen state after passing approximately 200 ns, and gradually increases until the time reaches approximately 1 μs. This phenomenon (characteristics) has been newly found by the inventors of the present invention. In this description of the present invention, the characteristics are called "negative droop characteristics". The negative droop characteristics are not generated in the conventional edge emitting laser element.

The inventors of the present invention have focused on the negative droop characteristics and have studied the reasons for the negative droop characteristics in detail. It has been found that the negative droop characteristics closely relate to the intensity of the light confinement in the lateral mode of the oxide confinement structure. In addition, it has been found that a surface emitting laser element in which the negative droop characteristics are prevented, that is, a surface emitting laser element having good negative droop characteristics may have a short service life.

SUMMARY OF INVENTION

In embodiments of the present invention, there is provided a surface emitting laser element, a surface emitting laser array in which plural of the surface emitting laser elements are arrayed, an optical scanning device using the surface emitting laser element or the surface emitting laser array, and an image forming apparatus using the optical scanning device in which negative droop characteristics are prevented without shortening the service life of the surface emitting laser element.

To achieve one or more of these and other advantages, according to one aspect of the present invention, there is provided a surface emitting laser element which emits light in a direction perpendicular to a surface of a substrate of the surface emitting laser element. The surface emitting laser element includes a resonator structural body including an active layer, and first and second semiconductor distributed Bragg reflectors which sandwich the resonator structural body and include a confinement structure which can confine an injection current and a lateral mode of oscillation light at the same time by surrounding a current passing through region with an oxide containing at least an oxide formed by oxidizing a part of a layer to be selectively oxidized containing aluminum. The thickness of the layer to be selectively oxidized is at least 25 nm, and the temperature when an oscillation threshold current becomes a minimum value is 25° C. or less in a relationship between the temperature and the oscillation threshold current.

Therefore, according to an embodiment of the present invention, negative droop characteristics can be prevented regardless of the size of the pulse period.

According to another aspect of the present invention, there is provided a surface emitting laser element which emits light in a direction perpendicular to a surface of a substrate of the surface emitting laser element. The surface emitting laser element includes a resonator structural body including an active layer, and first and second semiconductor distributed Bragg reflectors which sandwich the resonator structural body and include a confinement structure which can confine an injection current and a lateral mode of oscillation light at the same time by surrounding a current passing through region with an oxide containing at least an oxide formed by oxidizing a part of a layer to be selectively oxidized containing aluminum. The thickness of the layer to be selectively oxidized is at least 25 nm, the thickness of the oxide surrounding the current passing through region at the maximum thickness is 110 nm or less, and the temperature when an oscillation threshold current becomes a minimum value is 25° C. or less in a relationship between the temperature and the oscillation threshold current.

Therefore, according to another embodiment of the present invention, negative droop characteristics can be prevented regardless of the size of the pulse period without shortening the service life of the surface emitting laser element.

The features and advantages of the present invention will become more apparent from the following detailed description of a preferred embodiment given with reference to the accompanying drawings.

MODE(S) FOR CARRYING OUT THE INVENTION

Figure 1:
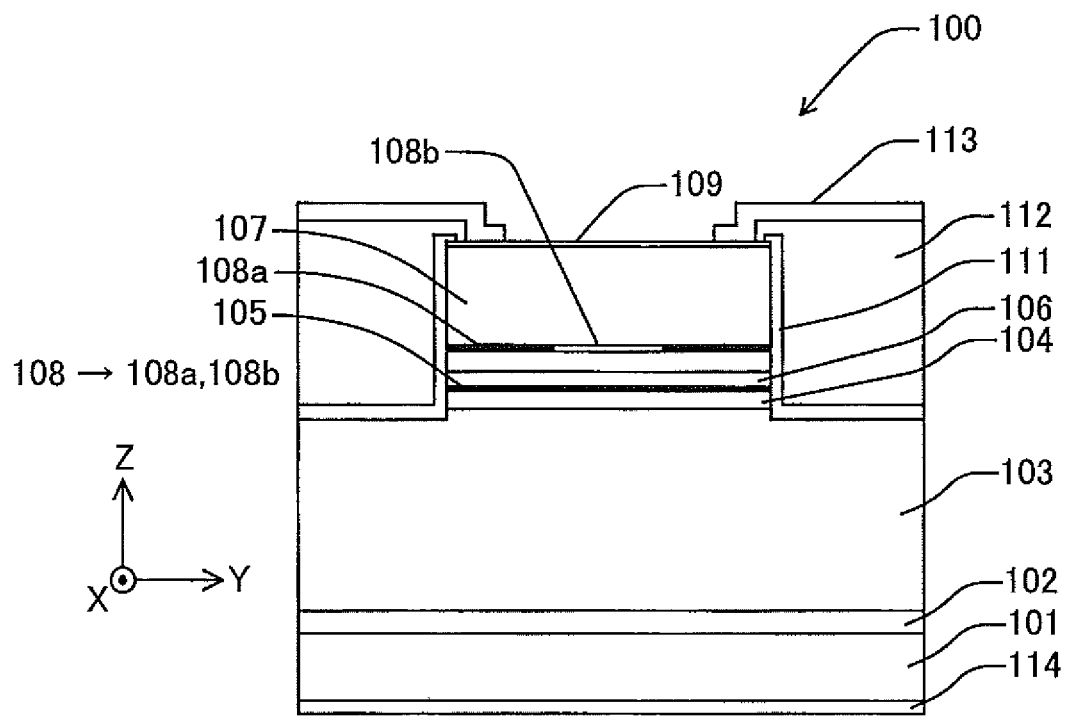
FIG. 1 is a cut-away side view of a surface emitting laser element according to a first embodiment of the present invention.

Referring to the drawings, embodiments of the present invention are described in detail.

[First Embodiment]

FIG. 1 is a cut-away side view of a surface emitting laser element 100 according to a first embodiment of the present invention. In the description of the present invention, the laser beam (light) radiating direction is a Z axis direction, and two directions orthogonal to each other on a surface perpendicular to the Z axis direction are an X axis direction and a Y axis direction, respectively.

A designed oscillation wavelength of the surface emitting laser element 100 is in a 780 nm band. In the surface emitting laser element 100, plural semiconductor layers such as a buffer layer 102, a lower semiconductor DBR (distributed Bragg reflector) (second semiconductor DBR) 103, a lower spacer layer 104, an active layer 105, an upper spacer layer 106, an upper semiconductor DBR (first semiconductor DBR) 107, and a contact layer 109 are sequentially stacked on a substrate 101. In the following, the above semiconductor layer stacked structure is called a first layer stacked body.

The substrate 101 is formed of an n-GaAs single crystal.

The buffer layer 102 is formed of n-GaAs.

The lower semiconductor DBR 103 includes 40.5 pairs of a low refractive index layer formed of $n-Al_{0.9}Ga_{0.1}As$ and a high refractive index layer formed of $n-Al_{0.3}Ga_{0.7}As$. In addition, in order to decrease an electric resistance value, a composition gradient layer of 20 nm thickness is formed between the low refractive index layer and the high refractive index layer in which the composition is gradually changed from one composition to the other composition. Each of the low and high refractive index layers are determined to have an optical thickness of $\lambda/4$ by including ½ of the adjacent composition gradient layers when the oscillation wavelength is $\lambda$.

When the optical thickness is $\lambda/4$, the actual thickness "h" is $h=\lambda/4N$ (N is the refractive index of a medium of the layer).

The lower spacer layer 104 is formed of non-doped $Al_{0.6}Ga_{0.4}As$.

The active layer 105 is a multiple quantum well layer formed of $Al_{0.15}Ga_{0.85}As/Al_{0.6}Ga_{0.4}As$.

The upper spacer layer 106 is formed of non-doped $Al_{0.6}Ga_{0.4}As$.

A part formed of the lower spacer layer 104, the active layer 105, and the upper spacer layer 106 is called a resonator structural body, and the thickness of the resonator structural body is determined to be the optical thickness of one wavelength. In order to obtain high stimulated emission probability, the active layer 105 is at a center of the resonator structural body which center corresponds to an anti-node position of a standing wave distribution of an electric field. The resonator structural body is sandwiched between the lower semiconductor DBR 103 and the upper semiconductor DBR 107.

The upper semiconductor DBR 107 includes 24 pairs of a low refractive index layer formed of $p-Al_{0.9}Ga_{0.1}As$ and a high refractive index layer formed of $p-Al_{0.3}Ga_{0.7}As$. In addition, in order to decrease an electric resistance value, a composition gradient layer of 20 nm thickness is formed between the low refractive index layer and the high refractive index layer in which the composition is gradually changed from one composition to the other composition. Each of the low and high refractive index layers are determined to have an optical thickness of $\lambda/4$ by including ½ of the adjacent composition gradient layers when the oscillation wavelength is $\lambda$.

The contact layer 109 is formed of p-GaAs.

Next, a manufacturing method of the surface emitting laser element 100 according to the first embodiment of the present invention is simply described.

(1-1): The first layer stacked body is formed by crystal growth with the use of an MOCVD (metal organic chemical vapor deposition) method, or an MBE (molecular beam epitaxy) method. At this time, a layer to be selectively oxidized 108 of 28 nm thickness formed of p-AlAs is inserted into one of the low refractive index layers of the upper semiconductor DBR 107.

In the above, as a raw material of III group, TMA (trimethyl aluminum), TMG (trimethyl gallium), or TMI (trimethyl indium) is used, and as a raw material of V group, an arsine ($AsH_3$) gas is used. In addition, as a raw material of p-type dopant, carbon tetrabromide ($CBr_4$) is used, and as a raw material of n-type dopant, hydrogen selenide ($H_2Se$) is used.

(1-2): A resist pattern having a square of 20 μm sides is formed on a surface of the first layer stacked body.

(1-3): A mesa having a quadrangular prism shape is formed by ECR (electron cyclotron resonance) etching with the use of a $Cl_2$ gas while using the square-shaped resist pattern as a photo-mask. In this, the bottom surface of the etching is positioned in the lower semiconductor DBR 103.

(1-4): The photo-mask is removed.

(1-5): A part of the layer to be selectively oxidized 108 in the mesa is selectively oxidized by applying heat to the first layer stacked body while being in water vapor. With this, a non-oxidized region 108b surrounded by an oxidized layer 108a remains at the center part of the mesa. Consequently, an oxide confinement structure is formed in which a driving current route of a light emitting part of the surface emitting laser element 100 is confined to the center part of the mesa. The non-oxidized region 108b is a current passing region (current injection region) and one side of the current passing region is 4.5 μm.

(1-6): A protection layer 111 of SiN is formed by using a CVD (chemical vapor deposition) method.

(1-7): The first layer stacked body is flattened by a polyimide layer 112.

(1-8): A window for a p-electrode contact is opened at the upper part of the mesa. In this, a mask of photoresist is formed, a part of the photoresist is removed by exposing an opening part at the upper part of the mesa, and the window is opened by etching the polyimide layer 112 and the protection layer 111 with the use of BHF (buffered hydrofluoric acid).

(1-9): A resist pattern of a square shape of 8 μm sides is formed at a region which becomes a light emitting part at the upper part of the mesa, and a p-electrode material is deposited by vapor deposition. As the p-electrode material, a multi-layered film formed of Cr/AuZn/Au or Ti/Pt/Au is used.

(1-10): A p-electrode 113 is formed by lifting off the electrode material at the light emitting part.

(1-11): The bottom surface of the substrate 101 is polished so that the thickness of the substrate 101 becomes, for example, 100 μm, and an n-electrode 114 is formed on the bottom surface of the substrate 101. The n-electrode 114 is formed of a multi-layered film of AuGe/Ni/Au.

(1-12): Ohmic contact between the p-electrode 113 and the n-electrode 114 is obtained by annealing. With this the mesa becomes the light emitting part.

(1-13): The surface emitting laser element 100 is formed as a chip by being cut off.

In a case where a rectangular current pulse whose pulse period is 1 ms and whose pulse width is 500 μs is supplied to the surface emitting laser element 100, when a light output at 10 ns after the supply is defined as P1 and a light output at 1 μs after the supply is defined as P2, it is obtained that (P1−P2)/P2=−0.05. In the following, in some cases, a value "(P1−P2)/P2×100" (%) is called a droop rate. Therefore, the droop rate in the surface emitting laser element 100 according to the first embodiment of the present invention is −5%.

[Modified Example of First Embodiment]

Figure 2:
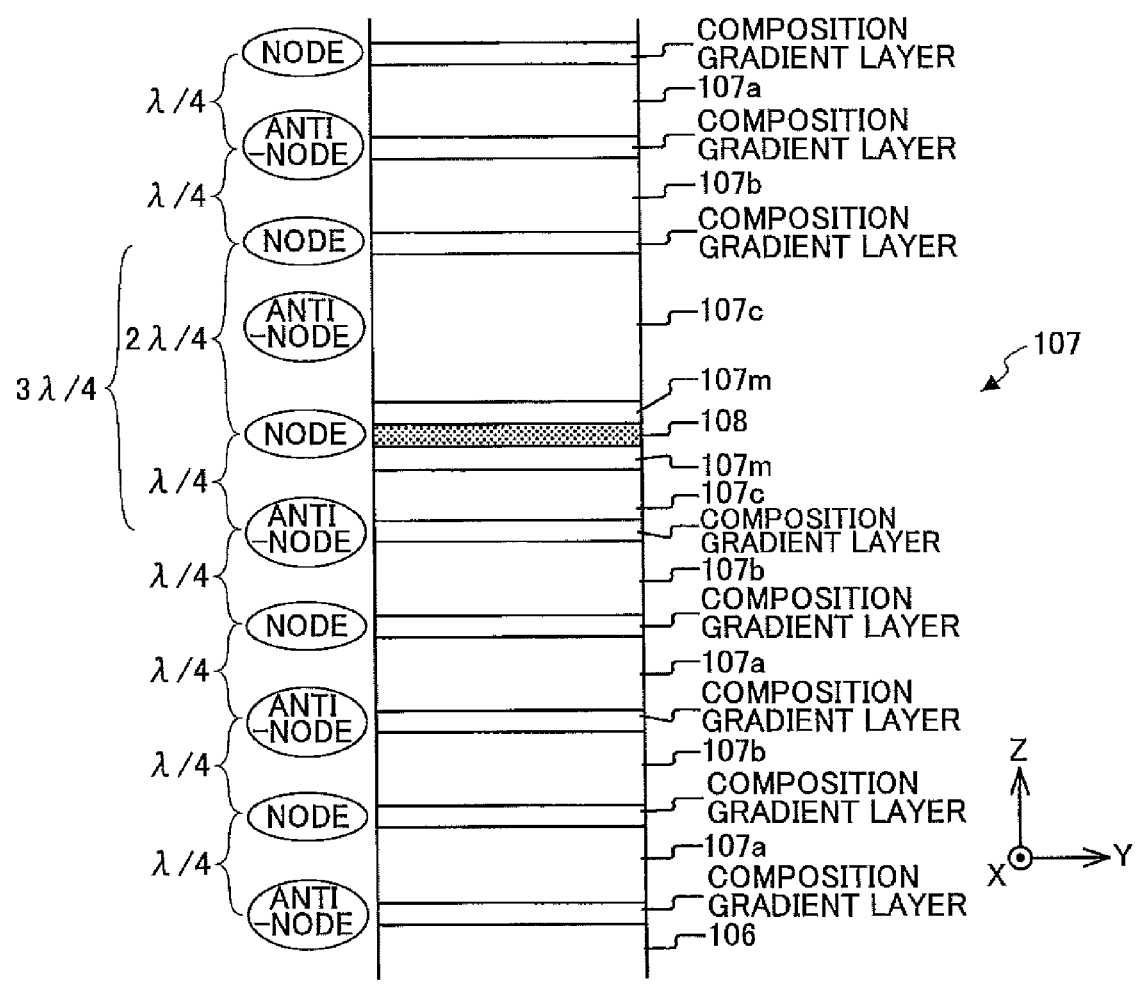
FIG. 2 is an enlarged view of a part of an upper semiconductor DBR according to a modified example of the first embodiment of the present invention.

Nest, referring to FIG. 2, a modified example of the first embodiment of the present invention is described. FIG. 2 is an enlarged view of a part of the upper semiconductor DBR 107 according to the modified example of the first embodiment of the present invention. In the modified example of the first embodiment of the present invention, when an element is similar to or the same as the element in the first embodiment of the present invention, the element has the same reference number as that of the first embodiment of the present invention.

As shown in FIG. 2, the upper semiconductor DBR 107 is at the +Z side of the upper spacer layer 106, and includes 26 pairs of low refractive index layers and high refractive index layers. In addition, in order to decrease an electric resistance value, composition gradient layers of 20 nm thickness are formed in which the composition is gradually changed from one composition to the other composition.

The layer to be selectively oxidized 108 of a thickness of 28 nm formed of p-AlAs is inserted inbetween low refractive index layers 107c of the upper semiconductor DBR 107. The position of the layer to be selectively oxidized 108 is optically separated from the upper spacer layer 106 by 5λ/4. The optical thickness including the low refractive index layers 107c and the layer to be selectively oxidized 108 is determined to be 3λ/4 including ½ of the adjacent composition gradient layers.

The layer to be selectively oxidized 108 and the composition gradient layer at the +Z side of the low refractive index layer 107c are determined to be positioned at the corresponding nodes of the standing wave.

Each of the low and high refractive index layers other than the low refractive index layers 107c including the layer to be selectively oxidized 108 is determined to have an optical thickness of λ/4 by including ½ of the adjacent composition gradient layers when the oscillation wavelength is λ.

In addition, as shown in FIG. 2, intermediate layers 107m formed of p-$Al_{0.83}Ga_{0.17}As$ with the thickness of 20 nm are formed at the −Z side and +Z side of the layer to be selectively oxidized 108.

The low refractive index layers 107c adjacent to the corresponding intermediate layers 107m are formed of p-$Al_{0.75}Ga_{0.25}As$.

Low refractive index layers 107a are formed of p-$Al_{0.9}Ga_{0.1}As$. High refractive index layers 107b are formed of p-$Al_{0.1}Ga_{0.9}As$.

That is, the layer to be selectively oxidized 108 is a part of the low refractive index layers of the upper semiconductor DBR 107, and the low refractive index layers including the layer to be selectively oxidized 108 include the two intermediate layers 107m adjacent to the layer to be selectively oxidized 108 and the two low refractive index layers 107c adjacent to the corresponding intermediate layers 107m. The content rate of Al in the intermediate layers 107m is lower than the content rate of Al in the layer to be selectively oxidized 108 by 17%. In addition, the content rate of Al in the low refractive index layers 107c is lower than the content rate of Al in the layer to be selectively oxidized 108 by 25%.

The contact layer 109 (see FIG. 1) is stacked at the +Z side of the upper semiconductor DBR 107 and is formed of p-GaAs.

In some cases, a body in which plural semiconductor layers are stacked on the substrate 101 is called a second layer stacked body in the modified example of the first embodiment of the present invention.

Next, a manufacturing method of the surface emitting laser element 100 according to the modified example of the first embodiment of the present invention is simply described.

In the modified example of the first embodiment of the present invention, "'" is added to the corresponding manufacturing processes of the first embodiment of the present invention.

(1'-1): The second layer stacked body is formed by crystal growth with the use of an MOCVD method, or an MBE method.

In the above, as a raw material of III group, TMA, TMG, or TMI is used, and as a raw material of V group, an arsine gas is used. In addition, as a raw material of p-type dopant, carbon tetrabromide ($CBr_4$) is used, and as a raw material of n-type dopant, hydrogen selenide ($H_2Se$) is used.

(1'-2): A resist pattern having a square of 20 μm sides is formed on a surface of the second layer stacked body.

(1'-3): A mesa having a quadrangular prism shape is formed by ECR etching with the use of a $Cl_2$ gas while using the square-shaped resist pattern as a photo-mask. In this, the bottom surface of the etching is positioned in the lower semiconductor DBR 103.

(1'-4): The photo-mask is removed.

(1'-5): A part of Al is selectively oxidized while heat is applied to the second layer stacked body in water vapor. In this, a part of Al in the layer to be selectively oxidized 108 and a part of the intermediate layers 107m are oxidized. With this, a non-oxidized region 108b surrounded by an oxidized layer 108a remains at the center part of the mesa. Consequently, an oxide confinement structure is formed in which a driving current route of a light emitting part of the surface emitting laser element 100 is confined to the center part of the mesa. The non-oxidized region 108b is a current passing region (current injection region). Heat treatment conditions are suitably selected so that one side of the current passing region becomes approximately 4.5 μm. Specifically, the holding temperature is selected to be 360° C. and the holding time is selected to be 33 minutes.

(1'-6): A protection layer 111 of SiN or $SiO_2$ is formed by using a CVD method.

(1'-7): The second layer stacked body is flattened by a polyimide layer 112.

(1'-8): A window for a p-electrode contact is opened at the upper part of the mesa. In this, a mask of photoresist is formed, a part of the photoresist is removed by exposing an opening part at the upper part of the mesa, and the window is opened by etching the polyimide layer 112 and the protection layer 111 with the use of BHF.

(1'-9): A resist pattern of a square shape of 8 μm sides is formed at a region which becomes a light emitting part at the upper part of the mesa, and a p-electrode material is deposited by vapor deposition. As the p-electrode material, a multi-layered film formed of Cr/AuZn/Au or Ti/Pt/Au is used.

(1'-10): A p-electrode 113 is formed by lifting off the electrode material at the light emitting part.

(1'-11): The bottom surface of the substrate 101 is polished so that the thickness of the substrate 101 becomes, for example, 100 μm, and an n-electrode 114 is formed on the bottom surface of the substrate 101. The n-electrode 114 is formed of a multi-layered film of AuGe/Ni/Au.

(1'-12): Ohmic contact between the p-electrode 113 and the n-electrode 114 is obtained by annealing. With this the mesa becomes the light emitting part.

(1'-13): The surface emitting laser element 100 is formed as a chip by being cut off.

In a case where a rectangular current pulse whose pulse period is 1 ms and whose pulse width is 500 μs is supplied to the surface emitting laser element 100, when a light output at 10 ns after the supply is defined as P1 and a light output at 1 μs after the supply is defined as P2, it is obtained that (P1−P2)/P2=−0.05. In the following, in some cases, a value "(P1−P2)/P2×100" (%) is called a droop rate. Therefore, the droop rate in the surface emitting laser element 100 according to the modified example of the first embodiment of the present invention is −5%.

In the following, in some cases, when the surface emitting laser element 100 according to the first embodiment (including the modified example) of the present invention is compared with other surface emitting laser elements, the reference number is omitted.

Figure 3:
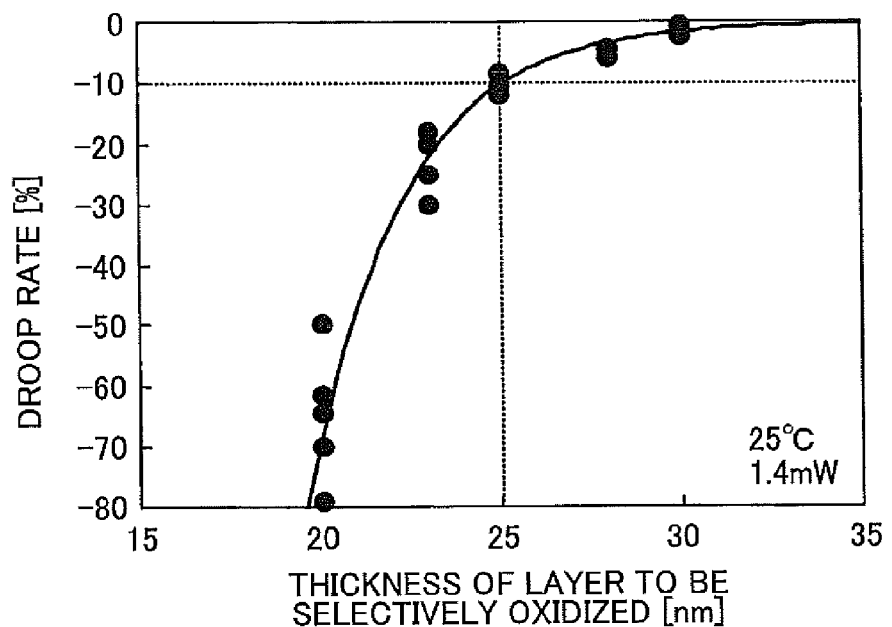
FIG. 3 is a graph showing a relationship between droop rate and thickness of a layer to be selectively oxidized at 25° C. in surface emitting laser elements.

FIG. 3 is a graph showing a relationship between the droop rate and the thickness of the layer to be selectively oxidized at 25° C. in surface emitting laser elements. As shown in FIG. 3, when the thickness of the layer to be selectively oxidized is reduced, the droop rate is lowered in an exponential manner (the negative droop rate is increased), the negative droop characteristics remarkably appear, and the droop rates of the elements are largely dispersed. When the droop rate is determined to be −10% or more (in the range from −10% to 0%), the thickness of the layer to be selectively oxidized 108 must be 25 nm or more. In this, when a surface emitting laser element whose droop rate is less than −10% is used (the negative droop rate is more than −10%), at least a part of a contour of an image output from a laser printer becomes frequently unclear when the image is viewed by a human eye. In addition, the thickness of the layer to be selectively oxidized 108 is preferably 28 nm or more when the dispersion in manufacturing the surface emitting laser element 100 is considered, and when the thickness of the layer to be selectively oxidized 108 is determined to be 30 nm or more, the image quality is hardly degraded.

Figure 4:
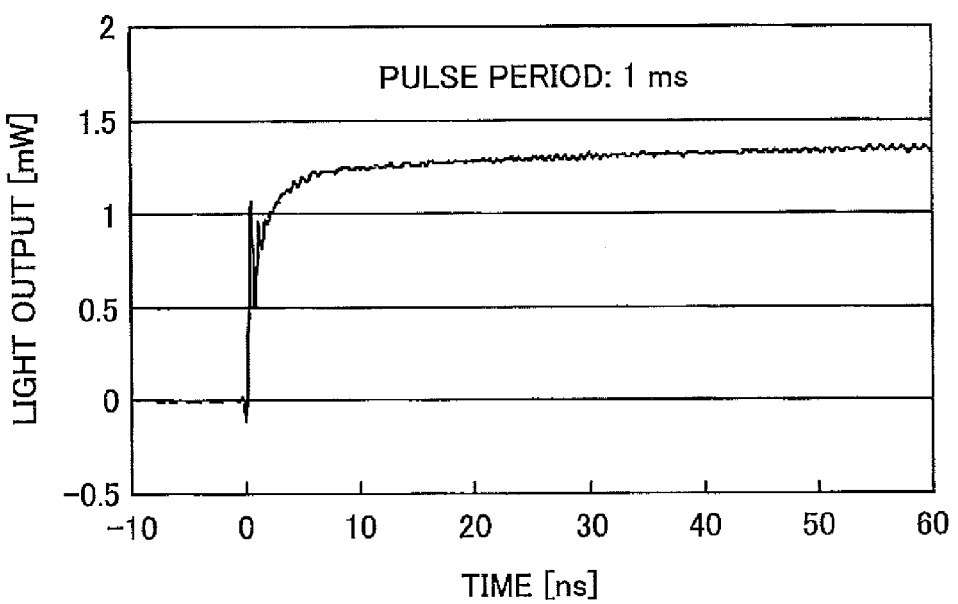
FIG. 4 is a graph showing a light pulse shape when a conventional surface emitting laser element is driven by a rectangular current pulse whose pulse period is 1 ms and whose duty ratio is 50%.
Figures 5, 6:
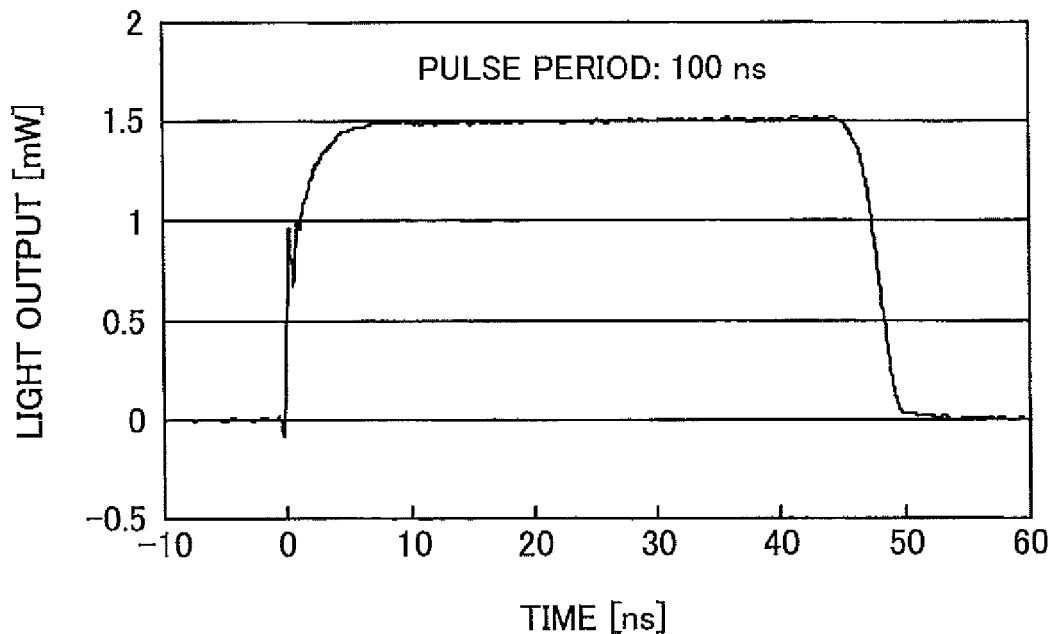
FIG. 5 is a graph showing a light pulse shape when the conventional surface emitting laser element is driven by a rectangular current pulse whose pulse period is 100 ns and whose duty ratio is 50%.
FIG. 6 is a table showing refractive indexes which are used in the calculation of an electric field strength distribution to obtain a lateral mode distribution of a surface emitting laser element.

The inventors of the present invention have studied light pulse shapes in detail when a conventional surface emitting laser element having a layer to be selectively oxidized is driven by many rectangular current pulses. FIG. 4 is a graph showing a light pulse shape when a conventional surface emitting laser element is driven by a rectangular current pulse whose pulse period is 1 ms and whose duty ratio is 50%. FIG. 5 is a graph showing a light pulse shape when a conventional surface emitting laser element is driven by a rectangular current pulse whose pulse period is 100 ns and whose duty ratio is 50%.

In the following, when a surface emitting laser element is generally described, the surface emitting laser element does not have a reference number.

As shown in FIG. 4, after the light output has risen, the light output is gradually increased and negative droop characteristics appear. In addition, even after 60 ns have passed, the light output does not reach 100% (1.4 mW). On the other hand, as shown in FIG. 5, after the light output has risen, the light output is stable and the negative droop characteristics do not appear.

As described above, in a case where a rectangular current pulse is supplied to a conventional surface emitting laser element, even if the duty ratio of the rectangular current pulse is the same, when the pulse period is long, the negative droop characteristics appear, and when the pulse period is short, the negative droop characteristics do not appear.

It is conceivable that internal temperatures of the surface emitting laser elements are different from each other when the pulse periods are different. That is, when the pulse period is long, since both the heat generating time and the cooling time are long, the internal temperature of the surface emitting laser element is greatly changed. On the other hand, when the pulse period is short, since the sequential cooling time cannot be sufficiently obtained, the internal temperature of the surface emitting laser element is not greatly changed, and the internal temperature is stable at an averaged high temperature. That is, the internal temperature is changed greatly under driving conditions in which the negative droop characteristics appear. It is conceivable that the negative droop characteristics are caused by the internal temperature of the surface emitting laser element.

When the internal temperature of the surface emitting laser element is changed, an electric field strength distribution in the lateral direction of the oscillation mode (hereinafter, in some cases, referred to as a lateral mode distribution) is changed.

The lateral mode distribution of the surface emitting laser element can be estimated by calculating an electric field strength distribution with the use of Mathematical Formulae (1) and (2) (Helmholtz Equations).

[Mathematical Formula (1)]

$$\left(\frac{\delta^2}{\delta x^2} + \frac{\delta^2}{\delta y^2} + k_0^2(\varepsilon(x, y) - n_{\mathit{eff},m}^2)\right)E_m(x, y, z) = 0 \quad (1)$$

[Mathematical Formula (2)]

$$E_m(x, y, z) = E_m(x, y)\exp(ik_0 n_{\mathit{eff},m} z) \quad (2)$$

However, it is difficult to analytically solve Mathematical Formulae (1) and (2); therefore, normally, a numerical analysis is performed by a finite element method with the use of a computer. As a solver of the finite element method, there are several solvers, and a commercially available VCSEL simulator (for example, LASER MOD) can be used.

As an example, a fundamental lateral mode distribution of a surface emitting laser element whose oscillation wavelength is in a 780 nm band is calculated.

In the surface emitting laser element used for calculation, the active layer has a triple quantum well structure formed of $Al_{0.12}Ga_{0.88}As$ (8 nm thickness)/$Al_{0.3}Ga_{0.7}As$ (8 nm thickness), and the spacer layers are formed of $Al_{0.6}Ga_{0.4}As$. In addition, the lower semiconductor DBR is formed of 40.5 pairs of $Al_{0.3}Ga_{0.7}As$ (high refractive index layer) and AlAs (low refractive index layer), and the upper semiconductor DBR is formed of 24 pair of $Al_{0.3}Ga_{0.7}As$ (high refractive index layer) and $Al_{0.9}Ga_{0.1}As$ (low refractive index layer).

The surface emitting laser element has a column-shaped mesa structure whose diameter is 25 μm so that the etching is performed until the boundary face between the lower semiconductor DBR and the lower spacer layer, and the region where the etching is applied is filled with air. That is, a simple etched mesa structure is formed. The diameter of the lower semiconductor DBR including the mesa where the etching has not been applied is 35 μm, and is the maximum width when the calculation is performed.

The material of the layer to be selectively oxidized is AlAs, the position of the layer to be selectively oxidized is in the low refractive index layer having optical thickness 3λ/4 of the upper semiconductor DBR, and the electric field strength distribution is positioned at the third node counted from the active layer 105.

In the calculation of the lateral mode distribution (the electric field strength distribution), an eigenmode distribution determined by the structure only is obtained without considering the gain of the active layer and the absorption of the light flux by the semiconductor material. In addition, the temperature of the surface emitting laser element is uniformly determined to be 300 K. Further, the refractive indexes of the corresponding layers are shown in FIG. 6 which are used in the calculation of the electric field strength distribution.

Figure 7:
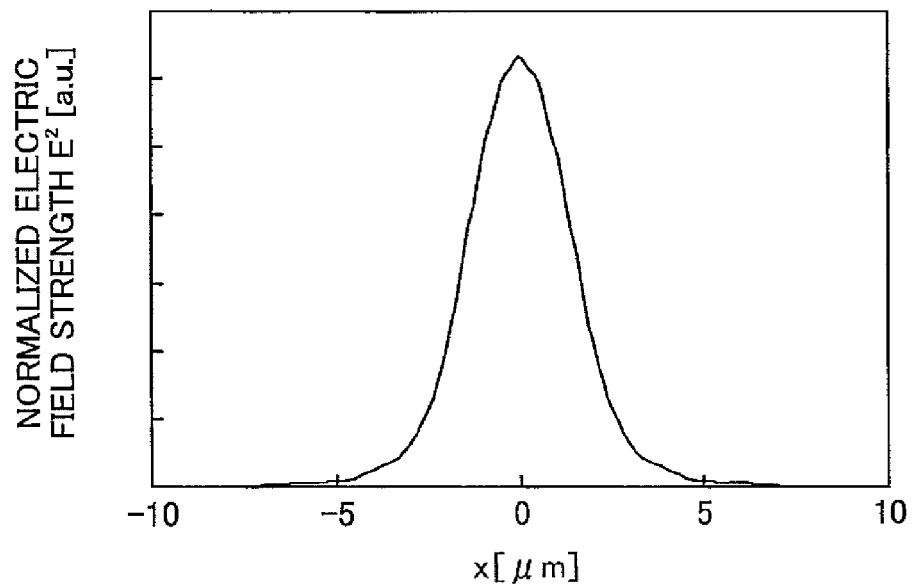
FIG. 7 is a graph showing a calculated result of a fundamental lateral mode distribution of a surface emitting laser element.

When the thickness of the layer to be selectively oxidized 108 of the oxide confinement structure is determined to be 30 nm, and the diameter of the current passing region (in some cases, referred to as an oxide confinement diameter) is determined to be 4 μm; a calculated result of the fundamental lateral mode distribution in the active layer is shown in FIG. 7. FIG. 7 is a graph showing a calculated result of a fundamental lateral mode distribution. In FIG. 7, the lateral axis "x" shows a distance from the center of the mesa in the radial direction and "x=0" shows the center of the mesa, and the longitudinal axis shows normalized electric field strength. In the following, in some cases, the oxidized layer in the oxide confinement structure is simply referred to as an oxidized layer.

Figure 8:
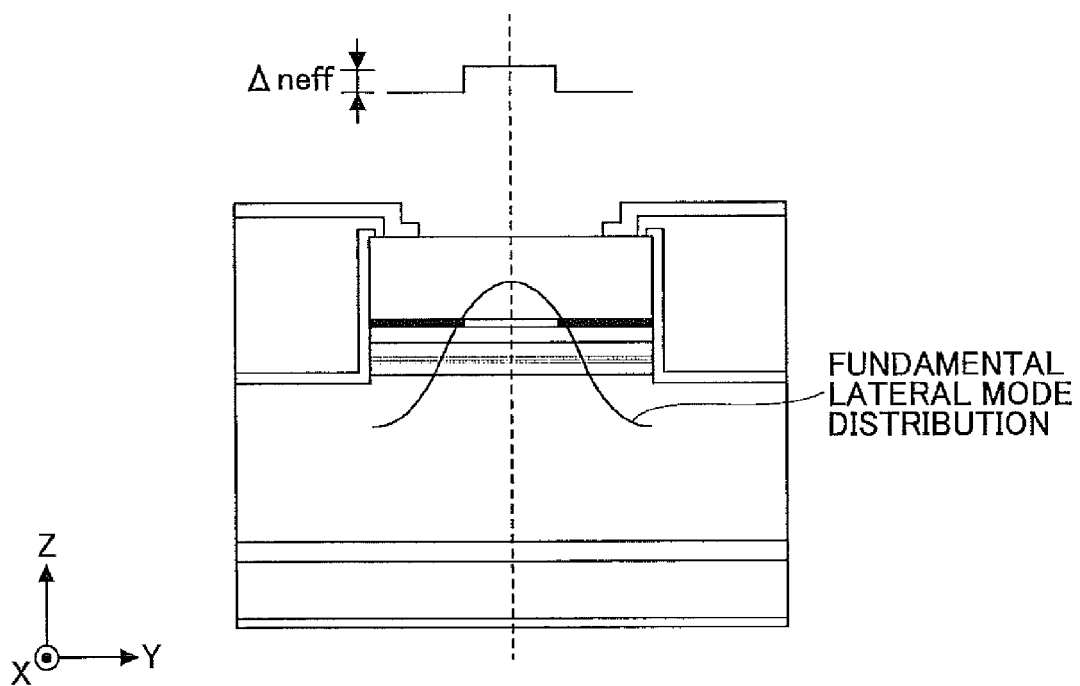
FIG. 8 is a diagram showing a built-in effective refractive index difference in a surface emitting laser element.

The refractive index of the oxidized layer is approximately 1.6 and is smaller than those (approximately 3.0) of the semiconductor layers near the oxidized layer; therefore, a so-called built-in effective refractive index difference Δneff exists inside the surface emitting laser element (see FIG. 8). FIG. 8 is a diagram showing the built-in effective refractive index difference Δneff in a surface emitting laser element.

Figure 9:
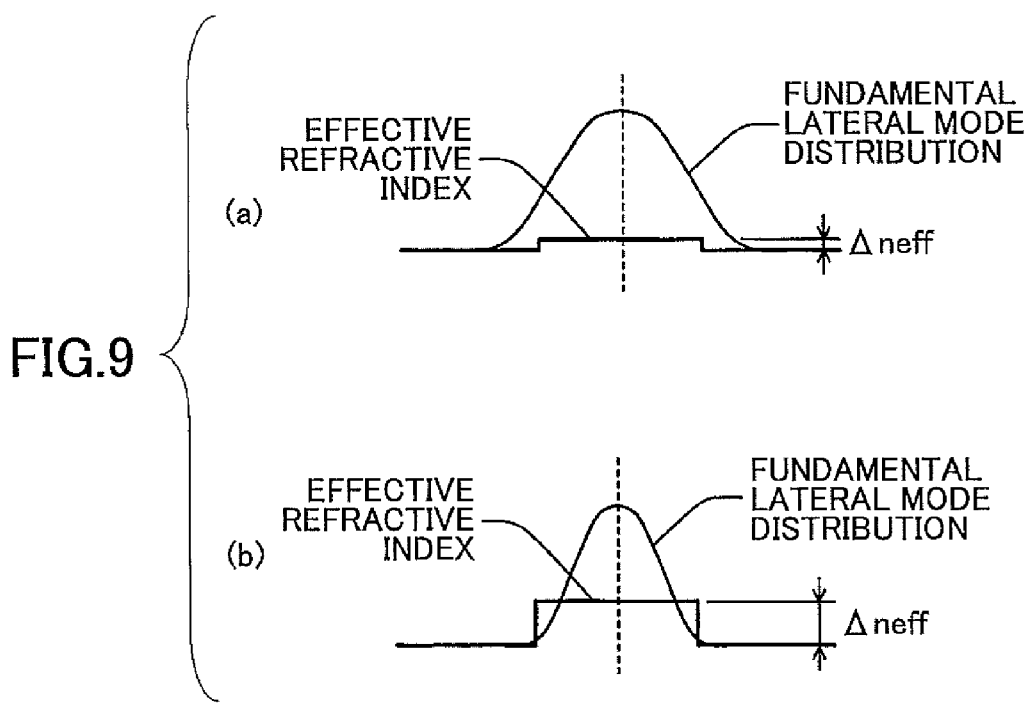
FIG. 9 is a diagram showing sizes of the effective refractive index differences and expansions of the fundamental lateral mode distributions.

The oscillation mode such as the fundamental lateral mode is confined in the lateral direction by the effective refractive index difference Δneff. At this time, the expansion of the oscillation mode in the lateral direction is determined by the size of the effective refractive index difference Δneff. As shown in FIGS. 9(a) and 9(b), when the effective refractive index difference Δneff is great (FIG. 9(b)), the expansion of the oscillation mode in the lateral direction is small. That is, the expansion of the fundamental lateral mode distribution is small. FIG. 9 is a diagram showing the sizes of the effective refractive index differences Δneff and the expansion of the fundamental lateral mode distribution.

When a driving current is supplied to the surface emitting laser element, the current concentrates on a center part of the mesa, the temperature of the center part of the mesa near the active layer partially rises due to Joule heat and nonradiative recombination in the active layer region. The semiconductor material has a property in which band gap energy is decreased and the refractive index becomes great when the temperature rises. Therefore, when the temperature of the center part of the mesa partially rises, the refractive index of the center part becomes larger than a part surrounded the center part, and light confinement in the lateral direction becomes great.

Figure 10:
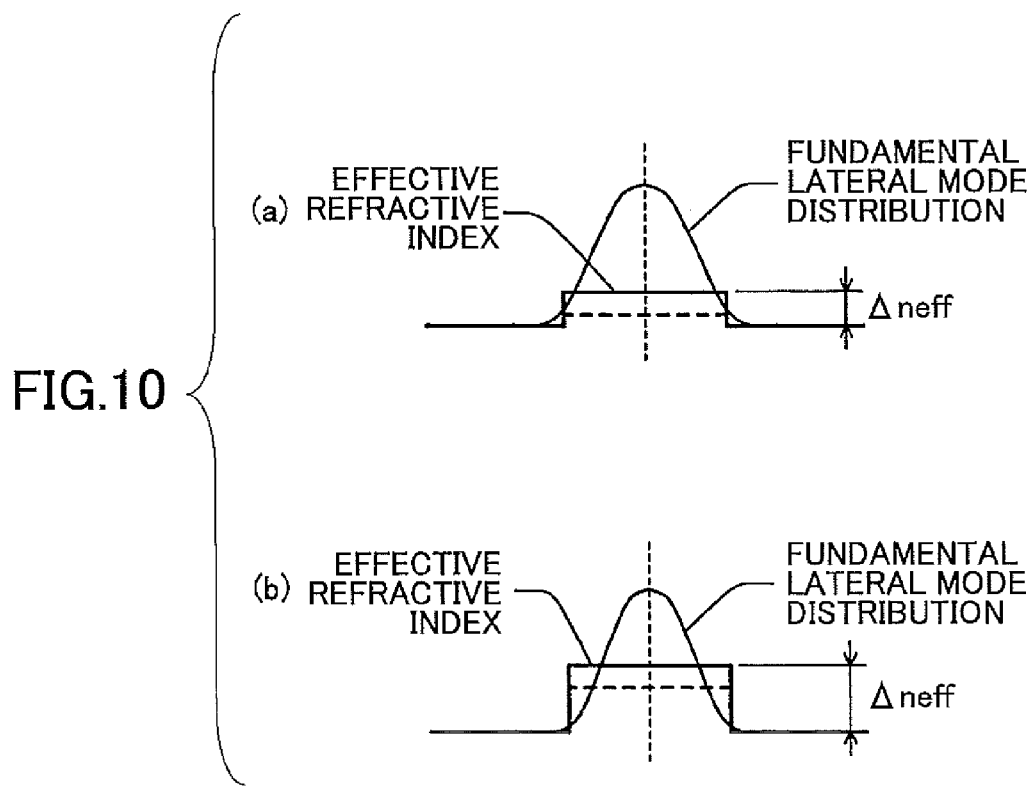
FIG. 10 is a diagram showing the effective refractive index difference when the internal temperature of the surface emitting laser element rises.

As shown in FIG. 9(a), in a case where the built-in effective refractive index difference Δneff is small, when the temperature of the center part of the mesa partially rises, as shown in FIG. 10(a), the effective refractive index difference Δneff is largely changed, and the fundamental lateral mode distribution is largely changed. In this case, a part where the gain region to which the current is being supplied overlaps the lateral mode distribution is increased, and a light confinement coefficient $\Gamma_1$ in the lateral direction is increased. Consequently, light intensity in the gain region is increased, the stimulated emission rate is increased, and an oscillation threshold current (hereinafter, in some cases, simply referred to as a threshold current) is lowered.

Figure 11:
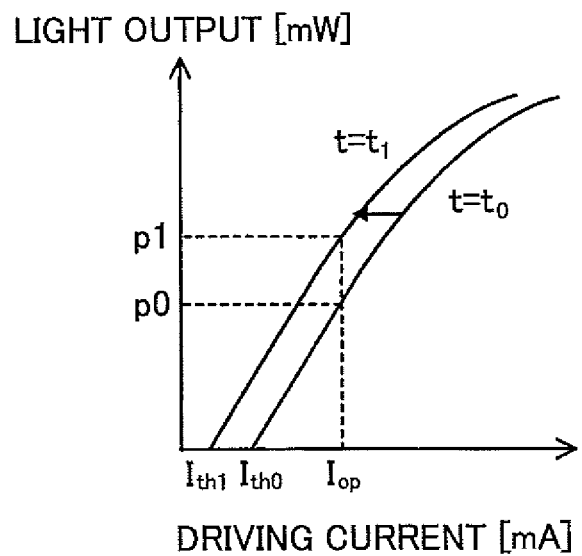
FIG. 11 is a graph showing an I-L curve in a surface emitting laser element whose light confinement in a lateral direction is insufficient at room temperature when the internal temperature rises.

As described above, in the surface emitting laser element whose built-in effective refractive index difference Δneff is small and the light confinement in the lateral direction at room temperature is not sufficient, when the internal temperature rises, an I-L curve (current-light output curve) (I-L characteristics) is totally shifted in a low current side, and the luminance efficiency is increased (see FIG. 11). In this case, the light output is increased with the passage of time at the same driving current value, and the negative droop characteristics appear (see FIG. 12).

Figure 12:
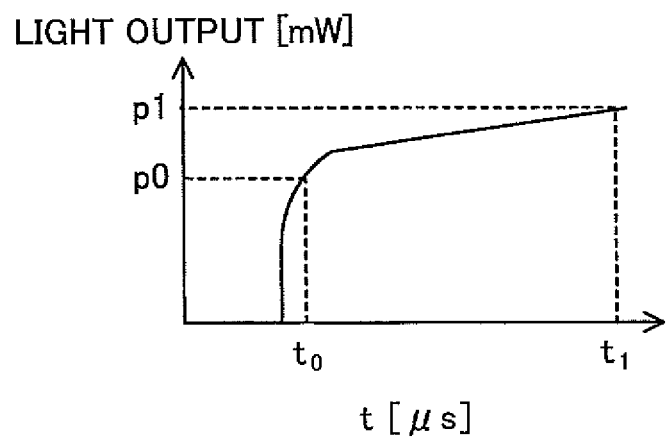
FIG. 12 is a graph showing a light pulse shape at the time shown in FIG. 11.

In FIG. 11, an I-L curve to be predicted at the time $t=t_0$ before the internal temperature rises and another I-L curve to be predicted at the time $t=t_1$ when the internal temperature sufficiently rises while a pulse (current) is applied are shown. When the temperature rises, since the luminance efficiency is increased and the threshold current is lowered, the I-L curve at the time $t_1$ is shifted in the low current side from the I-L curve at the time $t_0$. Since the driving current value $I_{op}$ of the pulse is constant, the light output p1 at the time $t_1$ is greater than the light output p0 at the time $t_0$. The light pulse shape at this time is shown in FIG. 12.

On the other hand, as shown in FIG. 9(b), in a case where the built-in effective refractive index difference Δneff is large, even if the temperature of the center part of the mesa rises, as shown in FIG. 10(b), the change of the effective refractive index difference Δneff is small, and the fundamental lateral mode distribution is not largely changed.

As described above, in the surface emitting laser element whose built-in effective refractive index Δneff is large and whose light confinement is sufficient in the lateral direction at room temperature, even if the internal temperature rises, the fundamental lateral mode distribution is stable and the change of the luminance efficiency is hardly generated. In this case, the light output at the same driving current is approximately stable with the passage of time, and the negative droop characteristics do not appear.

As an index to show light confinement strength in the lateral direction, there is a light confinement coefficient in the lateral direction (hereinafter simply referred to as a light confinement coefficient). When the value of the light confinement coefficient is large, since the electric field strength is concentrated on the gain region, the lateral mode distribution has an acute distribution. That is, when the light confinement coefficient is large at room temperature, since the light is sufficiently confined by the oxide confinement structure, the electric field strength distribution is stable against a disturbance such as a partial temperature change (refractive index change) in the gain region.

The light confinement coefficient is defined as a ratio of electric field integrated strength in a region of a radius of the current passing region to electric field integrated strength of a cross section in the diameter direction passing through the center of the surface emitting laser element. The light confinement coefficient is calculated by using Mathematical Formula (3) based on the calculated fundamental lateral mode distribution. In Mathematical Formula (3), "a" is the radius of the current passing region.

[Mathematical Formula (3)]

$$\Gamma_l = \frac{\int_0^a |E|^2 dr}{\int_0^\infty |E|^2 dr} \quad (3)$$

Figures 13, 14:
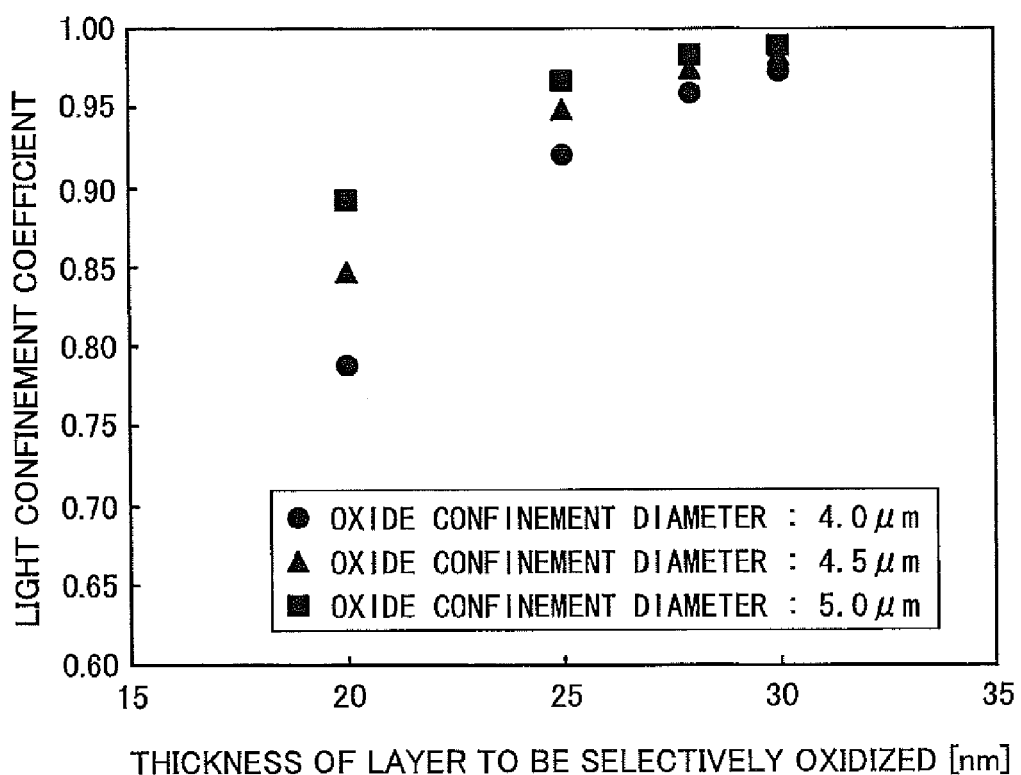
FIG. 13 is a table showing light confinement coefficients in a relationship between the thickness of the layer to be selectively oxidized and an oxide confinement diameter of an oxide confinement structure.
FIG. 14 is a graph showing the calculated results shown in FIG. 13.

FIG. 13 is a table showing the light confinement coefficients in a relationship between the thickness of the layer to be selectively oxidized and the oxide confinement diameter of the oxide confinement structure. In FIG. 13, in the surface emitting laser element of the 780 nm band, the light confinement coefficients in the fundamental lateral mode at room temperature are shown as the calculated results. The light confinement coefficient depends on the thickness of the layer to be selectively oxidized and the oxide confinement diameter. As shown in FIG. 13, the light confinement coefficient is large when the thickness of the layer to be selectively oxidized is large and the oxide confinement diameter is large.

FIG. 14 is a graph showing the calculated results shown in FIG. 13. In FIG. 14, the lateral axis shows the thickness of the layer to be selectively oxidized, and the longitudinal axis shows the light confinement coefficient. As shown in FIG. 14, in a case where the change of the light confinement coefficient is studied for the increase of the thickness of the layer to be selectively oxidized, when the oxide confinement diameters are different, in the region where the thickness of the layer to be selectively oxidized is less than 25 nm, the light confinement coefficients are largely changed among the different oxide confinement diameters, and when the thickness of the layer to be selectively oxidized is 25 nm or more, the light confinement coefficients show corresponding saturated tendencies.

Figures 15, 16:
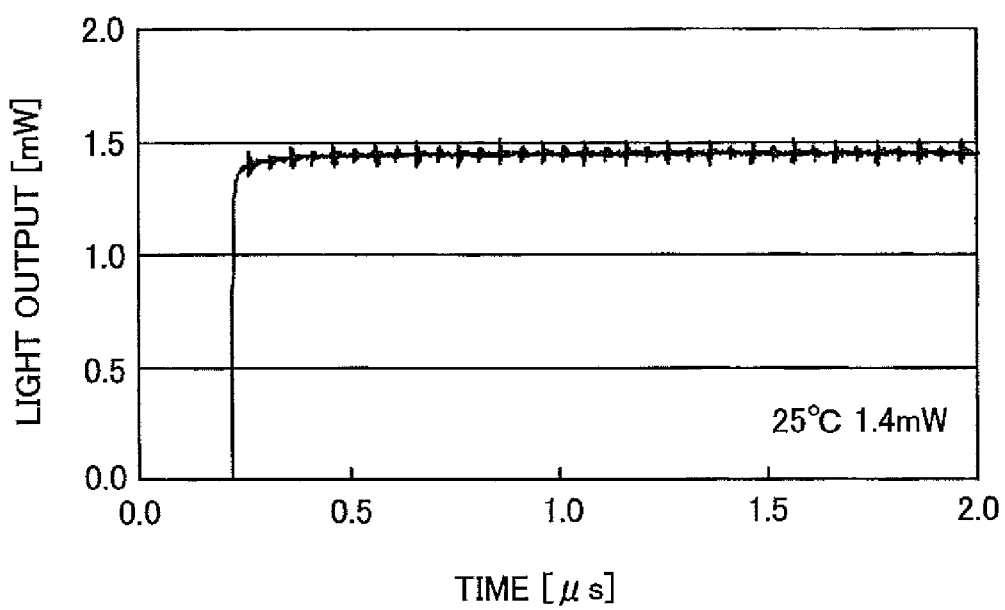
FIG. 15 is a table showing droop rates between the thickness of the layer to be selectively oxidized and the oxide confinement diameter.
FIG. 16 is a graph showing a light pulse shape of a surface emitting laser element whose light confinement coefficient is approximately 0.983 in the fundamental lateral mode at room temperature.

Actually, plural surface emitting laser elements were manufactured in which the thickness of the layer to be selectively oxidized and the oxide confinement diameter were different from each other, and the droop characteristics of the plural surface emitting laser elements were evaluated. The evaluated results are shown in FIG. 15. In FIG. 15, when the droop rate is −10% or more, "o" is shown, and when the droop rate is less than −10%, "x" is shown.

As shown in FIGS. 13 and 15, in the surface emitting laser elements whose light confinement coefficient is 0.9 or more in the fundamental lateral mode at room temperature, the droop rate of −10% or more can be obtained. In addition, since a generally frequently used oxide confinement diameter is within a range from 4.0 μm to 5.0 μm, as shown in FIG. 13, when the thickness of the layer to be selectively oxidized is 25 nm or more, the light confinement coefficient of 0.9 or more can be obtained.

FIG. 16 is a graph showing a light pulse shape of a surface emitting laser element whose light confinement coefficient is approximately 0.983 in the fundamental lateral mode at room temperature. At this time, the droop rate was approximately −4.3%.

Figure 17:
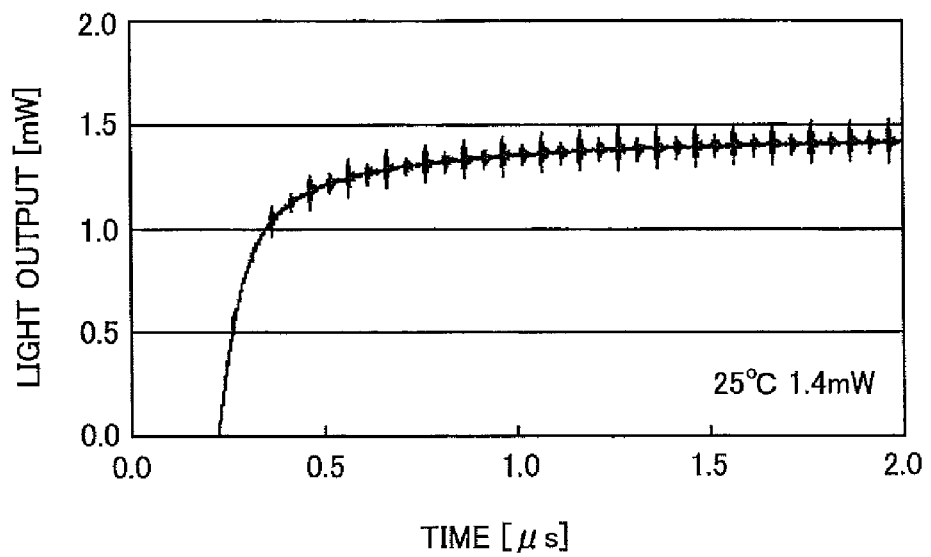
FIG. 17 is a graph showing a light pulse shape of a surface emitting laser element whose light confinement coefficient is approximately 0.846 in the fundamental lateral mode at room temperature.

FIG. 17 is a graph showing a light pulse shape of a surface emitting laser element whose light confinement coefficient is approximately 0.846 in the fundamental lateral mode at room temperature. At this time, the droop rate was approximately −62.8%.

As described above, when the light confinement coefficient is determined to be 0.9 or more in the fundamental lateral mode at room temperature, the negative droop characteristics can be lowered.

As described above, since the light confinement coefficient in the fundamental lateral mode is mainly determined by the two factors of the thickness of the layer to be selectively oxidized and the oxide confinement diameter, it is important to select a combination of the thickness of the layer to be selectively oxidized and the oxide confinement diameter.

When the inventors of the present invention tried several fitting methods, it was found that the calculated results (light confinement coefficients) shown in FIG. 13 can be fitted by a quadratic form of variables of the thickness of the layer to be selectively oxidized "t" nm (the thickness of the oxide surrounding the current passing through region) and the oxide confinement diameter "d" μm (the width of the current passing through region).

Mathematical Formula (4) is a fitted result of the light confinement coefficient Γ in the quadratic form of the thickness of the layer to be selectively oxidized "t" and the oxide confinement diameter "d". When specific values shown in FIG. 13 were substituted for the "d" and "t", the light confinement coefficient Γ in the fundamental lateral mode shown in FIG. 13 was obtained with an error of approximately 1%.

As described above, in order to effectively prevent the negative droop characteristics, it is required that the light confinement coefficient be 0.9 or more. Combinations (range) of the thickness of the layer to be selectively oxidized "t" and the oxide confinement diameter "d" can be obtained by Mathematical Formula (4).

[Mathematical Formula (4)]

$$\Gamma(d, t) = (-2.54d^2 - 0.14t^2 - 0.998d \cdot t + 53.4d + 12.9t - 216) \quad (4)$$

That is, the range is combinations of "t" and "d" satisfying an inequality "Γ(d, t)≥0.9". Specifically, the inequality is expressed by Mathematical Formula (5).

[Mathematical Formula (5)]

$$(-2.54d^2-0.14t^2-0.998d\cdot t+53.4d+12.9t-216)\geq 0.9 \qquad (5)$$

Therefore, when the thickness of the layer to be selectively oxidized "t" and the oxide confinement diameter "d" are selected to satisfy Mathematical Formula (5), the light confinement coefficient in the fundamental lateral mode becomes 0.9 or more, and a surface emitting laser element can be obtained in which the negative droop characteristics are lowered.

It has not been known previously that the effective refractive index difference Δneff influences the droop characteristics, and the inventors of the present invention have found the above for the first time.

Generally, the effective refractive index difference Δneff at room temperature becomes large when the layer to be selectively oxidized is thick and the layer to be selectively oxidized is positioned near the active layer. In this, when the degrees of the influences of the above two are compared, the degree of the influence of the thickness of the layer to be selectively oxidized is extremely greater than that of the position.

Therefore, the light confinement strength in the lateral direction at room temperature is mainly determined by the thickness of the layer to be selectively oxidized. In addition, it can be said that the thickness of the layer to be selectively oxidized is required to be 25 nm or more for preventing the negative droop characteristics.

In the process to selectively oxidize the layer to be selectively oxidized, the oxidation progresses in the direction parallel to the surface of the substrate but also slightly progresses in the direction perpendicular to the surface of the substrate. Therefore, when a cross section of the mesa in which the selective oxidation has been performed is observed by an electronic microscope, the thickness of the oxidized layer is not uniform, and the thickness of the outer circumferential part of the mesa is greater than the thickness of the oxidized tip of the mesa. However, the thickness of the oxidized layer in a region from the center part of the mesa to a part of 2 to 3 μm separated from the center part of the mesa in the outer circumferential direction is substantially the same as the thickness of the layer to be selectively oxidized. Since the oscillation light is mainly influenced by the effective refractive index difference Δneff of the oxidized tip of the mesa, when the thickness of the layer to be selectively oxidized is controlled to be a predetermined value (25 nm or more), the thickness of the oxidized layer of the oxidized tip can be a predetermined thickness.

Figure 18:
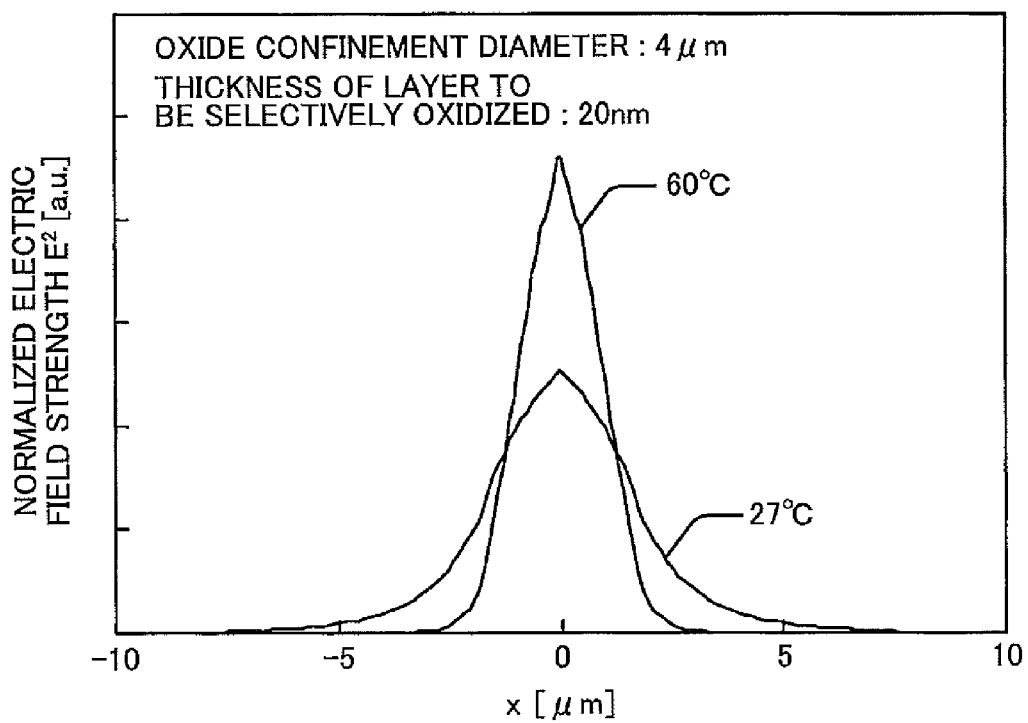
FIG. 18 is a first graph showing a change of a lateral mode distribution of a surface emitting laser element caused by self-heating of the surface emitting laser element.
Figure 19:
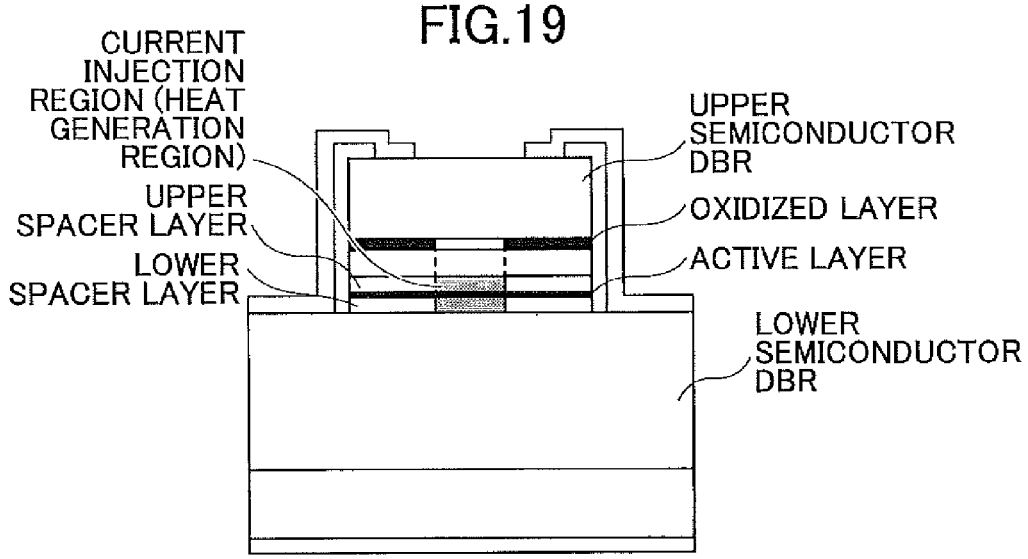
FIG. 19 is a diagram showing a heat generation region of the surface emitting laser element.

FIG. 18 is a first graph showing a change of a lateral mode distribution of a surface emitting laser element caused by self-heating of the surface emitting laser element. In FIG. 18, a surface emitting laser element was used in which the light confinement coefficient was approximately 0.788 at room temperature (27° C.), the oxide confinement diameter was 4 μm, and the thickness of the layer to be selectively oxidized was 20 nm. In FIG. 18, the change of the lateral mode distribution was calculated at 27° C. in the entire region of the surface emitting laser element. In addition, since it is assumed that the temperature of the current injection region (heat generation region) remarkably rises in the operating state, only the refractive index of the current injection region controlled by the oxidized layer was determined to be at the temperature of 60° C. in a resonance region (formed of spacer layers and an active layer sandwiched by a pair of semiconductor DBRs; see FIG. 19).

As shown in FIG. 18, when only the temperature of the current injection region of the resonance region was determined to be 60° C., the fundamental lateral mode distribution was narrowed when compared with the case of 27° C.; that is, a large change appeared in the fundamental lateral mode distribution. The light confinement coefficient of the fundamental lateral mode distribution was 0.987 when only the temperature of the current injection region of the resonance region was determined to be 60° C., and the changing rate of the light confinement coefficient of the fundamental lateral mode distribution was 25% of the case of 27° C. When the fundamental lateral mode distribution is unstable caused by the self-heating, the negative droop characteristics appear and this is not preferable in the surface emitting laser element.

Figure 20:
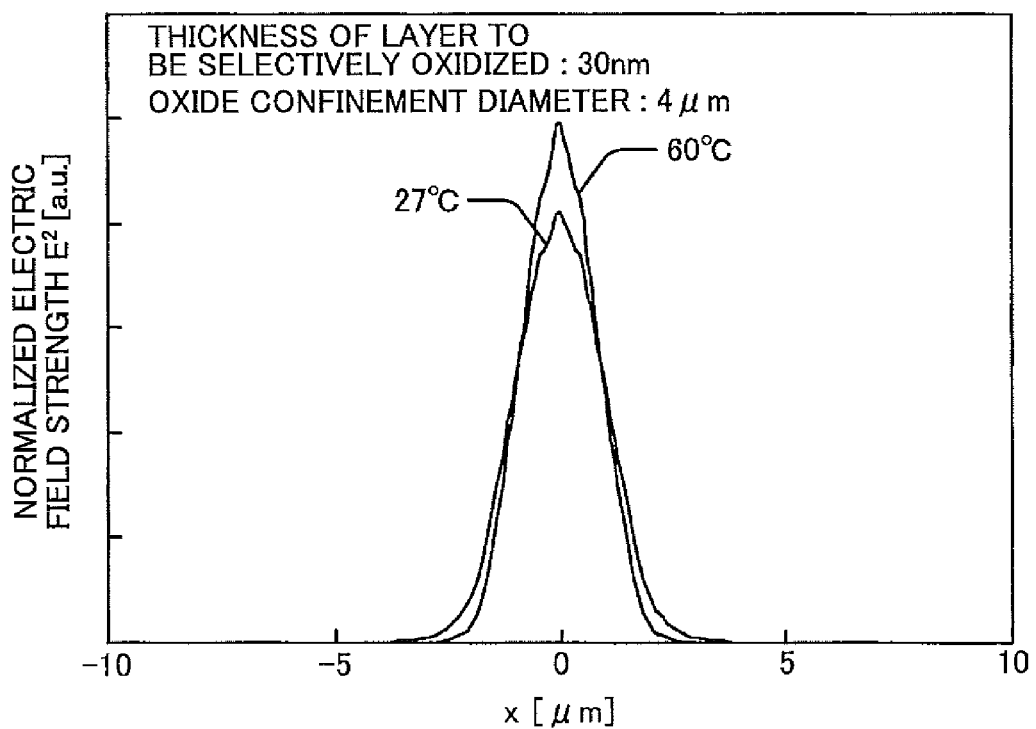
FIG. 20 is a second graph showing a change of a lateral mode distribution of a surface emitting laser element caused by self-heating of the surface emitting laser element.

FIG. 20 is a second graph showing a change of a lateral mode distribution of a surface emitting laser element caused by self-heating of the surface emitting laser element. In FIG. 20, a surface emitting laser element was used in which the light confinement coefficient was approximately 0.973 at room temperature (27° C.), the oxide confinement diameter was 4 μm, and the thickness of the layer to be selectively oxidized was 30 nm. As shown in FIG. 20, when only the temperature of the current injection region of the resonance region was determined to be 60° C., the light confinement coefficient was approximately 0.994, and the changing rate of the light confinement coefficient of the fundamental lateral mode distribution was 2.2% of the case of 27° C.

Figure 21:
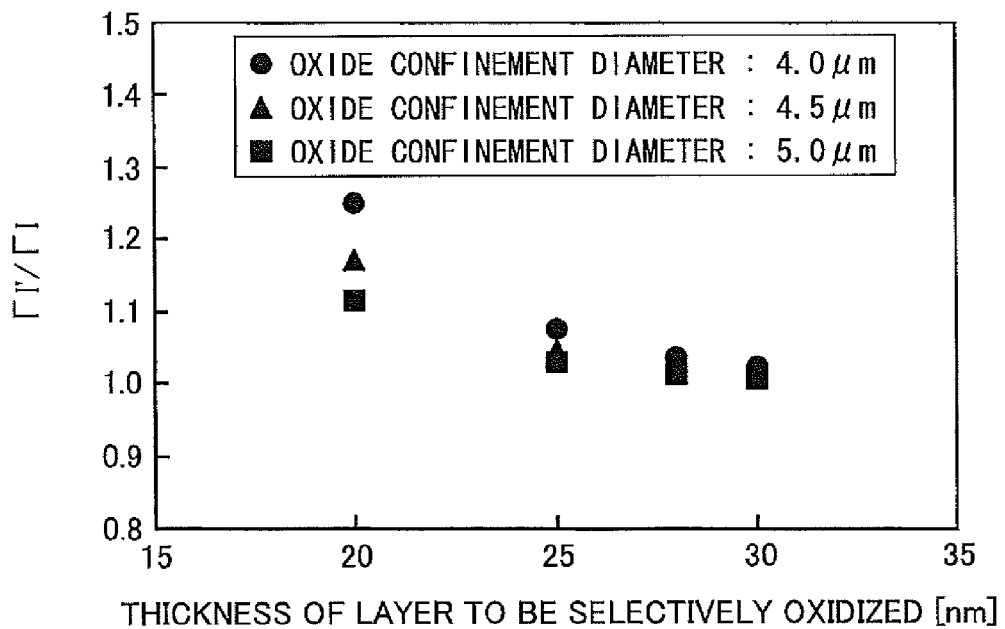
FIG. 21 is a diagram showing a ratio between light confinement coefficients relative to the thickness of the layer to be selectively oxidized in several surface emitting laser elements.

FIG. 21 is a diagram showing a ratio between light confinement coefficients relative to the thickness of the layer to be selectively oxidized in several surface emitting laser elements. In FIG. 21, a ratio (Γ1'/Γ1) of the light confinement coefficient "Γ1'" of the fundamental lateral mode when only the current injection region of the resonance region was determined to be 60° C. to the light confinement coefficient "Γ1" at room temperature was calculated in several surface emitting laser elements whose oxide confinement diameters were different from each other. As shown in FIG. 21, when the ratio (Γ1'/Γ1) was 1.1 or less (the changing rate was less than 10%), the droop rate was −5% or more and a suitable light pulse shape was obtained.

On the contrary, when the ratio (Γ1'/Γ1) was more than 1.1, the negative droop characteristics clearly appeared, and when the ratio (Γ1'/Γ1) became large, the droop rate became small (the negative droop rate became large).

As described above, in a case where the changing rate of the light confinement coefficient of the fundamental lateral mode when only the temperature of the current injection region of the resonance region is determined to be 60° C. relative to the light confinement coefficient of the fundamental lateral mode at room temperature is determined within 10%, the negative droop characteristics can be further prevented.

In the surface emitting laser element 100 according to the first embodiment (including the modified example) of the present invention, the light confinement coefficient of the fundamental lateral mode at room temperature (27° C.) was approximately 0.974. In addition, the light confinement coefficient of the fundamental lateral mode was approximately 0.996 when only the temperature of the current injection region of the resonance region (resonator structural body) was determined to be 60° C. That is, the changing rate of the light confinement coefficient was 2.2%.

Further, when the internal temperature of the surface emitting laser element is changed, the detuning amount (the difference between the resonance wavelength and the gain peak wavelength) is changed. Therefore, next, a relationship between the detuning amount and the negative droop characteristics is described.

In the edge emitting laser element, since the resonance longitudinal mode densely exists, the laser oscillation is generated at the gain peak wavelength $\lambda g$. On the other hand, in the surface emitting laser element, generally, the resonance wavelength is a single wavelength, and only a single longitudinal mode exists in the reflection band of the semiconductor DBR. In addition, since the laser oscillation is generated at a resonance wavelength $\lambda r$, the emission property of the surface emitting laser element depends on a relationship between the resonance wavelength $\lambda r$ and the gain peak wavelength $\lambda g$ of the active layer.

A detuning amount $\Delta\lambda_0$ is defined in Mathematical Formula (6). In Mathematical Formula (6), $\lambda r_0$ is a resonance wavelength and $\lambda g_0$ is a gain peak wavelength. The suffix "0" means a value when the surface emitting laser element is driven to perform CW (continuous wave oscillation) by a threshold current at room temperature. When the suffix "0" is not attached, cases other than the above show (appear). For example, the surface emitting laser element is driven by a current more than the threshold current.

[Mathematical Formula (6)]

$$\Delta\lambda_0 = \lambda r_0 - \lambda g_0 \quad (6)$$

Figure 22:
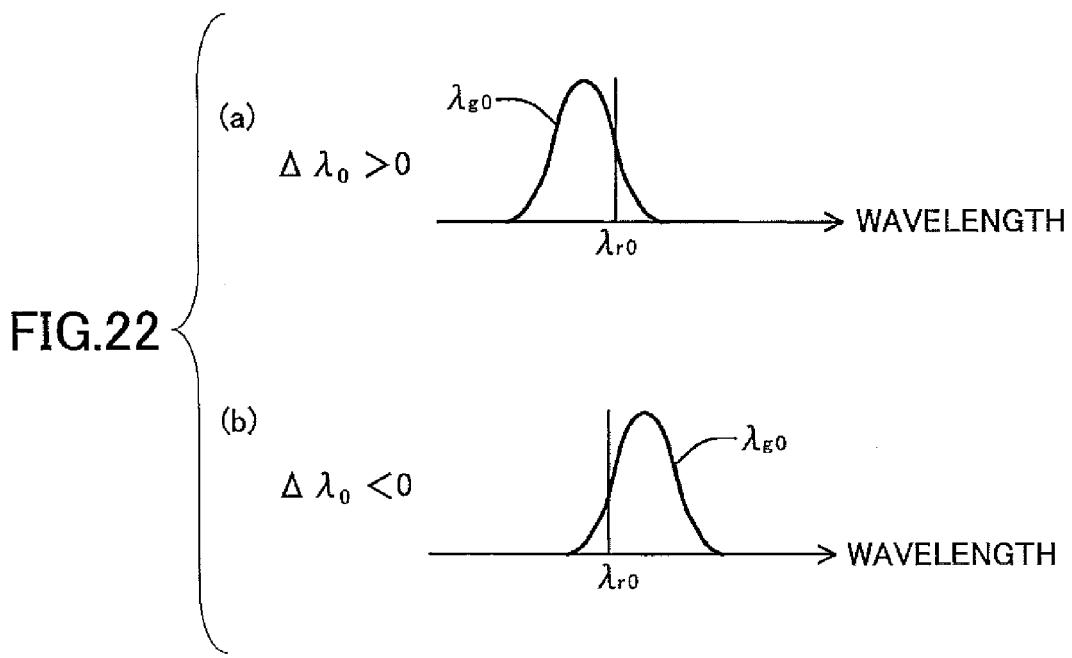
FIG. 22 is a diagram showing a relationship between the resonance wavelength and the peak gain wavelength in cases when detuning amounts are positive and negative.

In FIG. 22(a), a case that $\Delta\lambda_0 > 0$ is shown, and in FIG. 22(b), another case that $\Delta\lambda_0 < 0$ is shown.

The oscillation wavelength is determined by the resonance wavelength not by the gain peak wavelength. Therefore, the laser characteristics of sign of $\Delta\lambda_0$ and the size of $\Delta\lambda_0$. For example, the threshold current at room temperature is likely to be high whe the surface emitting laser element largely depend on the positive or negative n the absolute value of $\Delta\lambda_0$ is large.

The resonance wavelength and the gain peak wavelength are changed to the long wavelength side when the temperature rises. The change of the resonance wavelength is caused by a change of the refractive index of a material of the resonator structural body, and the change of the gain peak wavelength is caused by band gap energy of a material of the active layer. However, the changing rate of the band gap energy is approximately a single-digit above the changing rate of the refractive index. Therefore, the emission property at the change of the temperature is mainly determined by the changing amount of the gain peak wavelength. The changing rate of the resonance wavelength is approximately 0.05 nm/K, and can be substantially ignored.

In the surface emitting laser element, when the internal temperature (the temperature of the active layer) rises caused by an injection current change, the gain peak wavelength is shifted to the long wavelength side. Therefore, when the $\Delta\lambda_0 > 0$ (see FIG. 22(a)), the absolute value of the $\Delta\lambda$ (detuning amount) is decreased once and is increased after that.

Generally, in the surface emitting laser element, when the gain peak wavelength becomes equal to the resonance wavelength, the oscillation efficiency (luminance efficiency) becomes a maximum value.

In a case where $\Delta\lambda_0 > 0$, when the threshold current is measured by raising the internal temperature of the surface emitting laser element from room temperature, the threshold current starts to decrease while the internal temperature rises. The threshold current becomes a minimum value when the gain peak wavelength becomes equal to the resonance wavelength, and starts to increase when the internal temperature is further increased. That is, a temperature in which the threshold current becomes the minimum value exists at a higher temperature side than room temperature.

In a case where $\Delta\lambda_0 < 0$ (see FIG. 22(b)), when the internal temperature (the temperature of the active layer) of the surface emitting laser element rises, the absolute value of $\Delta\lambda$ is only increased simply; therefore, when the threshold current is measured by raising the internal temperature of the surface emitting laser element from room temperature, the threshold current is only increased when the internal temperature of the surface emitting laser element is increased.

In this case, when the internal temperature is decreased from room temperature, the gain peak wavelength $\lambda g$ is shifted to the short wavelength side. When the threshold current is measured by decreasing the internal temperature of the surface emitting laser element from room temperature, the threshold current starts to decrease, and when the gain peak wavelength becomes equal to the resonance wavelength, the threshold current becomes the minimum value. When the internal temperature is further decreased, the threshold current starts to increase. That is, in $\Delta\lambda_0 < 0$, a temperature at which the threshold current becomes the minimum value exists at a lower temperature side than room temperature.

Figure 23:
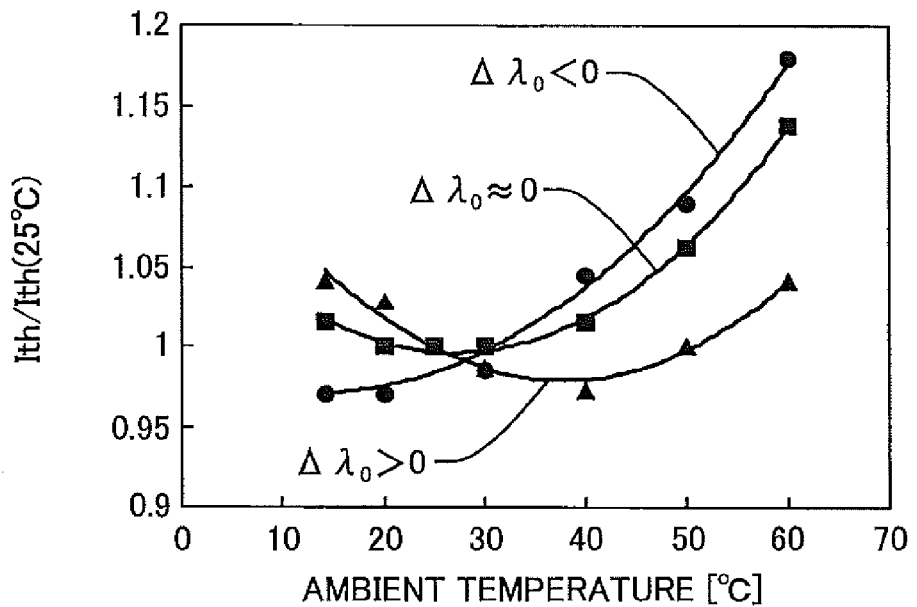
FIG. 23 is a graph showing measured results of oscillation threshold currents of three surface emitting laser elements whose detuning amounts are different from each other when the ambient temperature of the surface emitting laser elements is changed.

FIG. 23 shows measured results of oscillation threshold currents of three surface emitting laser elements whose detuning amounts $\Delta\lambda_0$ are different from each other when the ambient temperatures of the surface emitting laser elements are changed. In the three surface emitting laser elements, $\Delta\lambda_0 < 0$, $\Delta\lambda_0 \approx 0$, and $\Delta\lambda_0 > 0$. Further, in FIG. 23, the longitudinal axis shows a value in which an oscillation threshold current "Ith" at each temperature is divided by an oscillation threshold current "Ith at 25° C.", and the lateral axis shows the ambient temperature (the measured temperature) of the surface emitting laser elements. As shown in FIG. 23, the oscillation threshold current becomes the minimum value at the lower temperature side than room temperature when $\Delta\lambda_0 < 0$, at near room temperature when $\Delta\lambda_0 \approx 0$, and at the higher temperature side than room temperature when $\Delta\lambda_0 > 0$.

In the conventional surface emitting laser element, in order to prevent degradation of the emission property at the high temperature and high output operating state, $\Delta\lambda_0 > 0$ is determined so that the oscillation threshold current is normally decreased at the high temperature.

However, when the conventional surface emitting laser element determined to be $\Delta\lambda_0 > 0$ is driven by a rectangular current pulse, the I-L characteristics (current-light output characteristics) are shifted to the low current side corresponding to a rise of the internal temperature, and the (oscillation) threshold current is decreased. Therefore, the light output at the same driving current value is increased with the passage of time. That is, the negative droop characteristics appear. On the other hand, when $\Delta\lambda_0 < 0$, the I-L characteristics are shifted to the high current side when the internal temperature rises; therefore, the light output is not increased. That is, the negative droop characteristics do not appear. Therefore, in order to prevent the negative droop characteristics, in addition to determining the thickness of the oxidized layer, it must be controlled that the threshold current does not become the minimum value at room temperature or more by setting $\Delta\lambda_0 < 0$.

In order to set $\Delta\lambda_0$ to be a desirable value, the gain peak wavelength $\lambda g_0$ must be known. In the edge emitting laser element, since the oscillation wavelength becomes equal to the gain peak wavelength, the gain peak wavelength can be obtained from the oscillation wavelength. However, in the surface emitting laser element, the resonance wavelength is determined by the structure; therefore, the gain peak wavelength is hardly estimated.

In order to estimate the gain peak wavelength, one of the following two methods is used. In a first method, an edge emitting laser element having the same type active layer as that of the surface emitting laser element is manufactured, and a gain peak wavelength is estimated from an oscillation wavelength at room temperature. In a second method, a double hetero structure having the same type active layer as that of the surface emitting laser element is manufactured, and the gain peak wavelength is estimated from a PL (photo luminescence) wavelength.

For example, in the first method, an edge emitting laser element of an oxide film stripe type having the same active layer structure as that of a surface emitting laser element in which a stripe width is 40 μm and a resonator length is 500 μm is manufactured, and a wavelength in a threshold current of CW at room temperature of the edge emitting laser element is determined to be the gain peak wavelength $\lambda_{g0}$.

In the second method, since a wavelength at the laser oscillation is shifted to a long wavelength side relative to the PL wavelength, the shifted amount must be adjusted. The wavelength shift is caused by an excitation process difference such as a light excitation process and a current excitation process, and heat generated by a current in the current excitation process. Generally, the oscillation wavelength in the edge emitting laser element becomes a longer wavelength by approximately 10 nm than the PL wavelength $\lambda_{PL}$. Therefore, in this case, the wavelength shift amount is determined to be 10 nm.

Therefore, when the PL wavelength $\lambda_{PL}$ is determined to be a reference, Mathematical Formula (6) is converted into Mathematical Formula (7).

[Mathematical Formula (7)]

$$\Delta\lambda_0 = \lambda_{r0} - \lambda_{g0} = \lambda_{r0} - (\lambda_{PL} + 10) = \lambda_{r0} - \lambda_{PL} - 10 \quad (7)$$

The above wavelength shift amount 10 nm is a general value, and can be changed depending on a material to be used.

Figure 24:
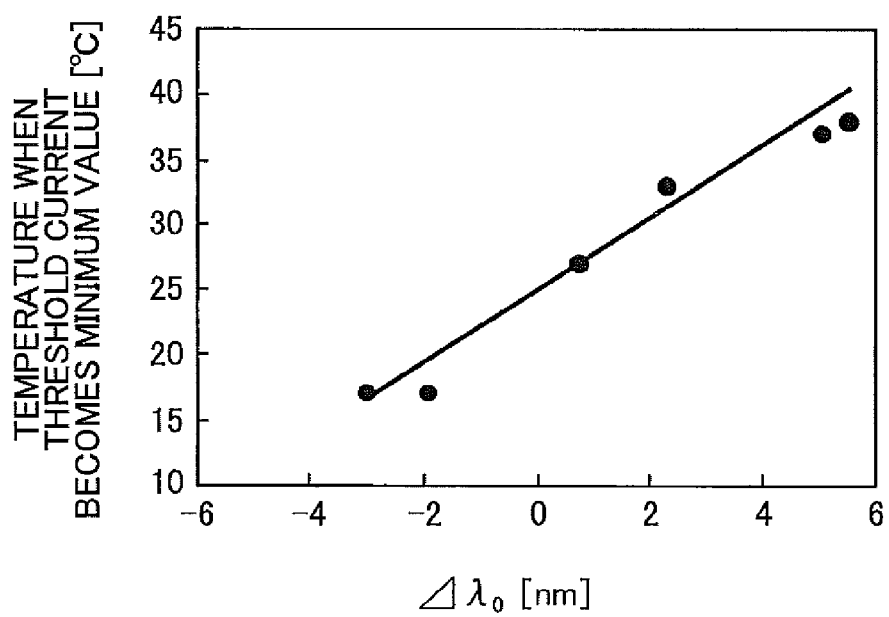
FIG. 24 is a graph showing a relationship between the detuning amount and temperature when a threshold current becomes a minimum value.

Plural surface emitting laser elements whose $\Delta\lambda_0$ are different from each other were manufactured, and a temperature was obtained in which the threshold current became the minimum value in each of the surface emitting laser elements. FIG. 24 shows the obtained results. As shown in FIG. 24, it is understandable that the threshold current becomes the minimum value at room temperature when $\Delta\lambda_0 = 0$.

Figure 25:
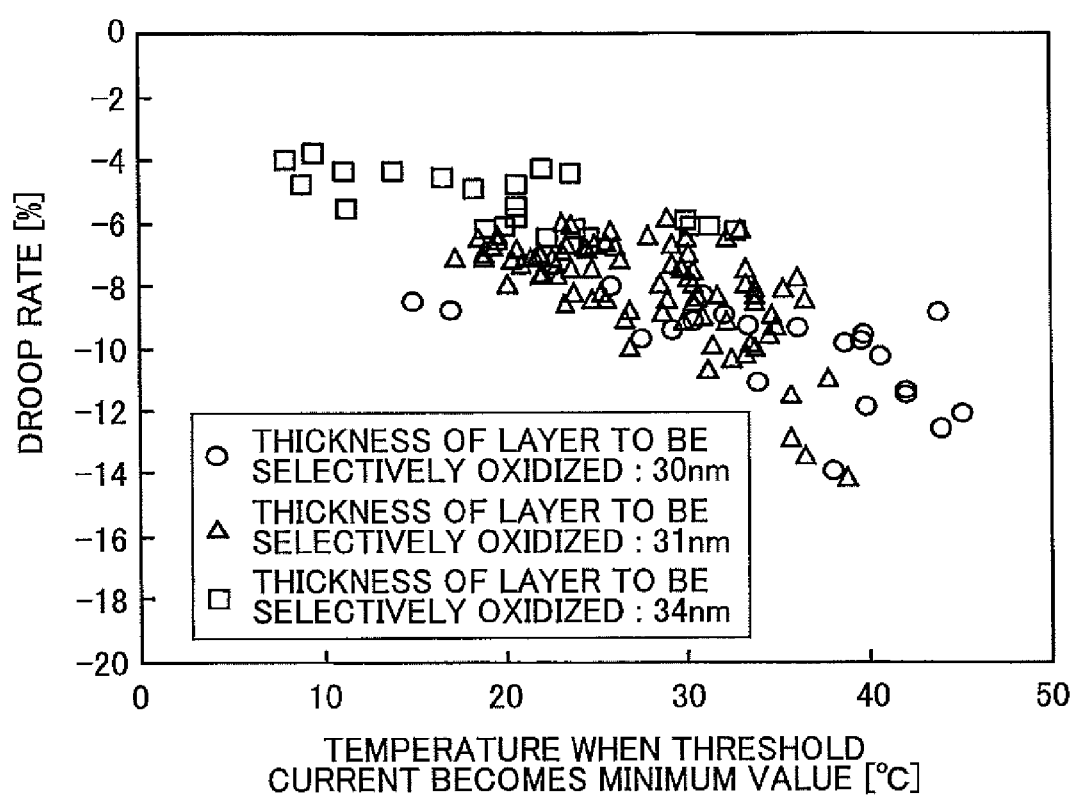
FIG. 25 is a diagram showing a relationship between the droop rate and the temperature when the threshold current becomes the minimum value in each of the surface emitting laser elements.

Next, plural surface emitting laser elements whose thicknesses of the layers to be selectively oxidized are different from each other (30, 31, and 34 nm) were manufactured, and a temperature when the threshold current becomes a minimum value and a droop rate in each of the surface emitting laser elements were obtained. FIG. 25 shows a relationship between the droop rate and the temperature when the threshold current becomes the minimum value in each of the surface emitting laser elements.

In FIG. 25, first, the surface emitting laser elements are focused on in which the thickness of the layer to be selectively oxidized is the same. In any of the surface emitting laser elements whose temperature is 25° C. or less when the threshold current becomes the minimum value, the absolute value of the droop rate is small (close to 0) and is approximately constant. On the other hand, in the surface emitting laser elements in which the temperature is 25° C. or more when the threshold current becomes the minimum value, the droop rate becomes small (the negative droop rate becomes large) when the temperature at the minimum threshold current becomes large.

In the surface emitting laser elements whose temperature at the minimum threshold current is higher than room temperature, when the temperature of the active layer is increased by the current supply, the oscillation efficiency is increased. Therefore, as described above, the negative droop characteristics remarkably appear. In addition, in the surface emitting laser elements whose temperature at the minimum threshold current is higher than room temperature, since the oscillation efficiency at the initial current supply time is low, the oscillation efficiency after the initial current supply becomes large, and the negative droop characteristics remarkably appear.

Next, in FIG. 25, the difference of the thicknesses of the layers to be selectively oxidized is focused on. In the surface emitting laser elements in which the temperature at the minimum threshold current is 25° C. or less, when the thickness of the layer to be selectively oxidized is large, the droop rate is close to 0, and the negative droop characteristics are prevented. As described above, when the thickness of the layer to be selectively oxidized is large, the light confinement coefficient by the oxidized layer is large and the fundamental lateral mode distribution becomes stable against the temperature change.

In the surface emitting laser elements shown in FIG. 25, since the thickness of the layer to be selectively oxidized is 25 nm or more, in the surface emitting laser elements whose temperatures at the minimum threshold current are 25° C. or less, the droop rate is −10% or more (the droop rate is in the range from −10% to 0%), and the negative droop characteristics are effectively prevented.

As described above, in order to prevent the negative droop characteristics, the detuning amount $\Delta\lambda_0$ and the light confinement coefficient are determined so that the emission efficiency of the surface emitting laser element when the temperature of the active layer rises is not higher than that at room temperature.

In the surface emitting laser element 100 according to the first embodiment (including the modified example) of the present invention, the PL wavelength of the active layer 105 is determined to be 772 nm, the detuning amount $\Delta\lambda_0$ at room temperature is determined to be −2 nm, and the threshold current becomes the minimum value at approximately 17° C.

Plural surface emitting laser elements whose light confinement coefficients are different from each other were manufactured under the condition that the temperature at the minimum threshold current is 25° C. or less, and the plural surface emitting laser elements were studied in detail. As the study results, when the light confinement coefficient was approximately 0.9, the droop rate was approximately −5%. When the light confinement coefficient was made to be higher than 0.9, the droop rate was increased.

In the surface emitting laser element whose light confinement coefficient is less than 0.9, a tendency was found in which, when the light confinement coefficient was small, the droop rate became small; and the surface emitting laser element whose droop rate was −70% or less was found.

As described above, the surface emitting laser element 100 according to the first embodiment of the present invention includes the resonator structural body including the active layer 105, and the lower semiconductor DBR 103 and the upper semiconductor DBR 107 sandwich the resonator structural body. The upper semiconductor DBR 107 includes the oxide confinement structure which can confine the injection current and the lateral mode of the oscillating light at the same time. In the oxide confinement structure, the oxidized layer 108a, which contains at least an oxide formed when a part of the layer to be selectively oxidized 108 including Al was oxidized, surrounds the current passing through region 108b (non-oxidized region). The thickness of the layer to be selectively oxidized 108 is 28 nm, and the temperature is approximately 17° C. when the threshold current becomes the minimum value. With this, the negative droop characteristics can be prevented regardless of the pulse period.

In addition, a rectangular current pulse whose pulse period is 1 ms and whose pulse width is 500 μs is supplied, (P1−P2)/P2=−0.05, and the negative droop characteristics can be further prevented.

In addition, in the surface emitting laser element 100, the light confinement coefficient in the lateral direction of the fundamental lateral mode in the oxide confinement structure at room temperature is approximately 0.974. Therefore, the negative droop characteristics are further more prevented.

In addition, in the surface emitting laser element 100, when only the temperature of the current injection region of the resonator structural body is changed from room temperature to 60° C., the changing rate of the light confinement coefficient is 2.2%, and the negative droop characteristics are still more prevented.

In addition, in the surface emitting laser element 100, the gain peak wavelength in the oscillation threshold current at room temperature is longer by 2 nm than the resonance wavelength of the resonator structural body; therefore, the negative droop characteristics can be further more prevented.

Next, the modified example of the first embodiment of the present invention is described in more detail.

Figure 26:
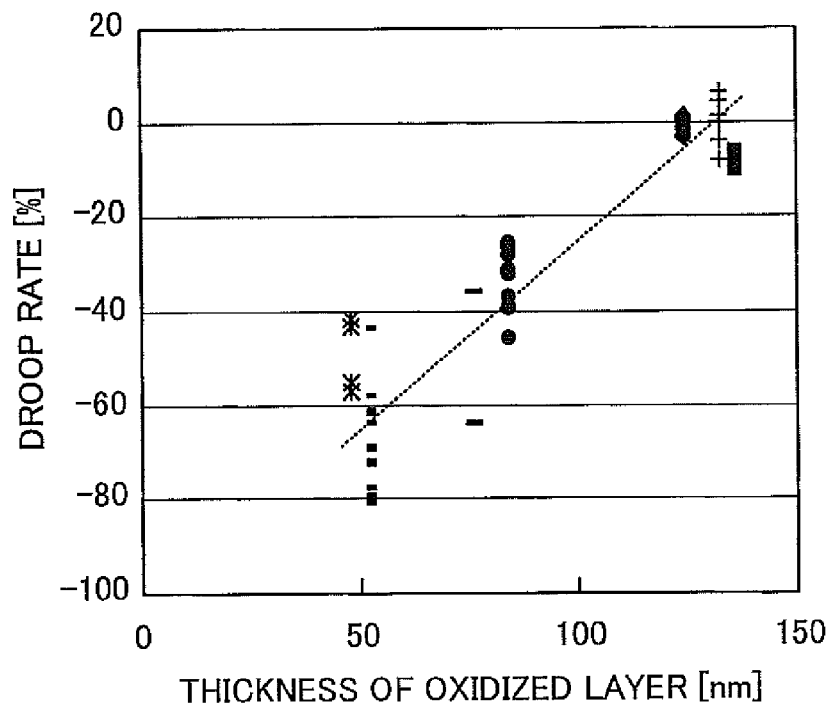
FIG. 26 is a graph showing a relationship between the droop rate and the thickness of an oxidized layer at a surrounding part of a mesa when the thickness of the layer to be selectively oxidized is 20 nm.

FIG. 26 is a graph showing a relationship between the droop rate and the thickness of the oxidized layer 108a at the surrounding part of the mesa when the thickness of the layer to be selectively oxidized 108 is 20 nm. In FIG. 26, a symbol shows the surface emitting laser elements 100 manufactured in a lot. In addition, the surface emitting laser element 100 does not include the intermediate layer 107m and the low refractive index layer 107c is formed of $Al_{0.83}Ga_{0.17}As$.

As shown in FIG. 26, the thickness of the oxidized layer 108a at the surrounding part of the mesa is different among the lots in the same structure of the surface emitting laser elements 100 and the thickness of the oxidized layer 108a relates to the droop rate. When the thickness of the oxidized layer 108a is determined to be extremely large, even if the thickness of the layer to be selectively oxidized 108 is less than 25 nm, a suitable droop rate (small droop rate) can be obtained.

Figure 27:
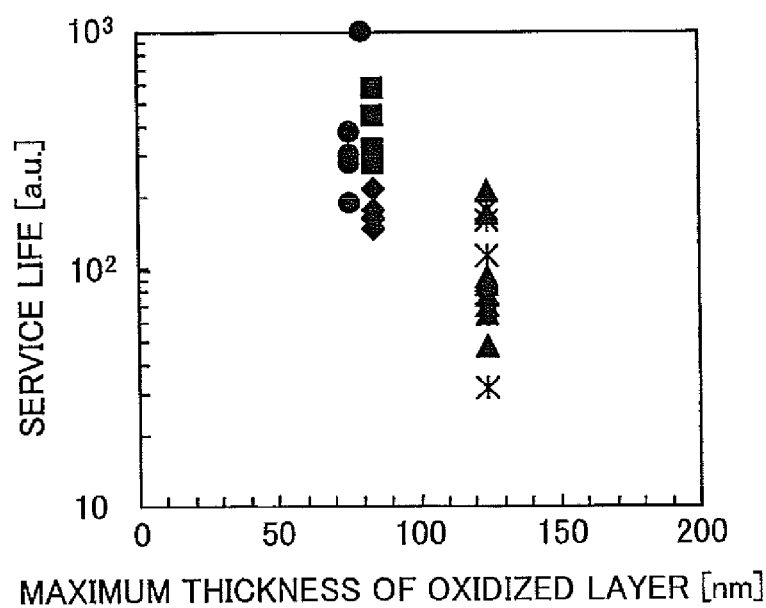
FIG. 27 is a graph showing a relationship between service life of each of surface emitting laser arrays formed of the surface emitting laser elements and the maximum thickness of the oxidized layer.

However, when the thickness of the oxidized layer 108a is determined to be extremely large, it has been found that the service life of the surface emitting laser element 100 is shortened. FIG. 27 is a graph showing a relationship between the service life of surface emitting laser arrays formed of the surface emitting laser elements 100 and the maximum thickness of the oxidized layer 108a.

In FIG. 27, the surface emitting laser element 100 does not include the intermediate layer 107m and the low refractive index layer 107c is formed of $Al_{0.83}Ga_{0.17}As$. In addition, plural lots of the surface emitting laser arrays are formed by arraying the plural surface emitting laser elements 100. Then the service life and the maximum thickness of the oxidized layer 108a are measured. In addition, a symbol shows the surface emitting laser arrays manufactured in a lot.

In addition, a driving current is controlled by feedback so that the light output from each light emitting part becomes constant, and the service life is determined to be the elapsed time when at least one of the driving currents of the light emitting parts becomes 120% or more of the initial driving current.

In particular, when the thickness of the oxidized layer 108a at the surrounding part of the mesa was 125 nm, the surface emitting laser element 100 quickly deteriorated. In addition, from another experiment, the service life of the surface emitting laser element 100 when the maximum thickness of the oxidized layer 108a was 60 nm was substantially the same service life as when the maximum thickness of the oxidized layer 108a was 80 nm. Further, when the maximum thickness of the oxidized layer 108a was more than 110 nm, the deterioration of the surface emitting laser element 100 was accelerated. The service life of the surface emitting laser element 100 is within an acceptable range when the thickness of the oxidized layer 108a is 125 nm; however, when the dispersion of the thicknesses in the manufacturing process is considered, it is preferable that the thickness of the oxidized layer 108a be 110 nm or less.

When a semiconductor containing Al (for example, AlAs) is oxidized, $Al_xO_y$ is formed, the volume of the semiconductor is reduced, and distortion is generated in the semiconductor. The size of the distortion is large when the thickness of the oxidized layer 108a is large. When the thickness of the oxidized layer 108a becomes more than 110 nm, the distortion influences the active layer 105, a defect occurs in the active layer 105, and the service life of the surface emitting laser element 100 is shortened.

In addition, when the thickness of the oxidized layer 108a is large, a single mode output becomes small, and a light divergence angle becomes wide. When the thickness of the oxidized layer 108a at the surrounding part of the mesa becomes more than 110 nm, the single mode output and the light divergence angle are dispersed among the surface emitting laser elements 100.

That is, in order to obtain a desirable droop rate, when the thickness of the oxidized layer 108a at the surrounding part of the mesa is determined to be more than 110 nm, the service life of the surface emitting laser element 100 is shortened, and the single mode output and the light divergence angle are dispersed among the surface emitting laser elements 100.

When the oxide confinement structure of the surface emitting laser element 100 is observed by using an SEM (scanning electronic microscope), in the oxidized layer 108a, the thickness of the outer circumferential part of the mesa is at thickest 60 nm to 70 nm, and is not largely dispersed among the surface emitting laser elements 100.

In addition, the current passing through region 108b (non-oxidized region) is a square having a desirable size. Further, the characteristics such as the single mode output, the light divergence angle, and the service life are not largely dispersed among the surface emitting laser elements 100. The above characteristics are advantageous when a surface emitting laser array is formed by the surface emitting laser elements 100.

As described above, in the modified example of the first embodiment of the present invention, in order to control the thickness of the oxidized layer 108a, the surface emitting laser element 100 includes the intermediate layers 107m (the first layers) and the low refractive index layers 107c (the second layers).

As described above, the surface emitting laser element 100 according to the modified example of the first embodiment of the present invention includes the resonator structural body including the active layer 105, and the lower semiconductor DBR 103 and the upper semiconductor DBR 107 sandwich the resonator structural body. The upper semiconductor DBR 107 includes the oxide confinement structure which can confine the injection current and the lateral mode of the oscillating light at the same time. In the oxide confinement structure, the oxidized layer 108a, which contains at least an oxide formed when a part of the layer to be selectively oxidized 108 including Al has been oxidized, surrounds the current passing through region 108b (non-oxidized region).

The thickness of the layer to be selectively oxidized 108 is 28 nm, the thickness of the oxidized layer 108a is 60 nm to 70 nm at the thickest part, and the temperature is approximately 17° C. when the threshold current becomes the minimum value.

With this, in the surface emitting laser element 100, the negative droop characteristics can be prevented regardless of the pulse period without shortening the service life.

In addition, a rectangular current pulse whose pulse period is 1 ms and whose pulse width is 500 μs is supplied, (P1−P2)/P2=−0.05, and the negative droop characteristics can be further prevented.

In addition, in the surface emitting laser element 100, the light confinement coefficient in the fundamental lateral mode of the oxide confinement structure at room temperature is approximately 0.96; therefore, the negative droop characteristics are further more prevented.

In addition, in the surface emitting laser element 100, when only the temperature of the current injection region of the resonator structural body is changed from room temperature to 60° C., the changing rate of the light confinement coefficient is 3.0%, and the negative droop characteristics are still more prevented.

In addition, in the surface emitting laser element 100, the gain peak wavelength in the oscillation threshold current at room temperature is longer than the resonance wavelength of the resonator structural body by 2 nm; therefore, the negative droop characteristics can be further more prevented.

In addition, the layer to be selectively oxidized 108 is a part of the low refractive index layer of the upper semiconductor DBR 107, the low refractive index layer including the layer to be selectively oxidized 108 includes the two intermediate layers 107m to sandwich the layer to be selectively oxidized 108 and the two low refractive index layers 107c adjacent to the corresponding intermediate layers 107m. The content rate of Al in the intermediate layer 107m is lower than the content rate of Al in the layer to be selectively oxidized 108 by 17%. In addition, the content rate of Al in the low refractive index layer 107c is lower than the content rate of Al in the layer to be selectively oxidized 108 by 25%.

With this, when Al is selectively oxidized, the oxidation speed in the X-Y surface of the layer to be selectively oxidized 108 and the oxidation thickness of the layer to be selectively oxidized 108 can be sufficiently controlled. Therefore, the dispersion of the thicknesses of the oxidized layers 108a among the surface emitting laser elements 100 can be easily made small. That is, the yield can be increased in the manufacturing of the surface emitting laser elements 100. Consequently, the thickness of the oxidized layer 108a can be prevented from being greater than a predetermined thickness unintentionally, an influence of distortion in the oxidized layer 108a on the active layer 105 can be decreased, and the surface emitting laser element 100 can have a long service life.

In addition, since the optical thickness of the low refractive index layers 107c and 107m including the layer to be selectively oxidized 108 is determined to be 3λ/4 including ½ of the adjacent composition gradient layers, the layer to be selectively oxidized 108 and the composition gradient layer at the +Z side of the low refractive index layer 107c are positioned at the corresponding nodes of the standing wave. With this, the diffraction loss of the light flux at the layer to be selectively oxidized 108 and the absorption loss of the light flux at the composition gradient layer having a high doping concentration can be decreased.

When the oscillation wavelength is λ and the optical thickness of the low refractive index layers 107m and 107c including the layer to be selectively oxidized 108 is (2n+1)λ/4 (n is an integer), the layer to be selectively oxidized 108 and the composition gradient layer at the +Z side of the low refractive index layer 107c can be positioned at the corresponding nodes of the standing wave.

In the modified example of the first embodiment of the present invention, the intermediate layers 107m are disposed to sandwich the layer to be selectively oxidized 108. However, when the thickness of the oxidized layer 108a at the thickest part is 110 nm or less, one of the intermediate layers 107m can be omitted. In addition, when the thickness of the oxidized layer 108a at the thickest part can be determined to be 110 nm or less, the intermediate layers 107m can be omitted.

In addition, the content rates of Al in the layer to be selectively oxidized 108 and the intermediate layer 107m are not limited to the above rates. However, it is preferable that the difference between the content rate of Al in the layer to be selectively oxidized 108 and the content rate of the intermediate layer 107m be 5% or more and 20% or less.

In addition, the content rate of Al in the low refractive index layer 107c is not limited to the above rate. However, it is preferable that the difference between the content rate of Al in the layer to be selectively oxidized 108 and the content rate of the low refractive index layer 107c be more than 20%. The low refractive index layer 107c functions to stop oxidizing in the Z direction (the stacking direction) and to increase the reflection coefficient as a reflecting mirror of the light flux. Therefore, it is preferable that the Al composition of the low refractive index layer 107c be smaller than that of the low refractive index layer 107a.

[Second Embodiment]

Figure 28:
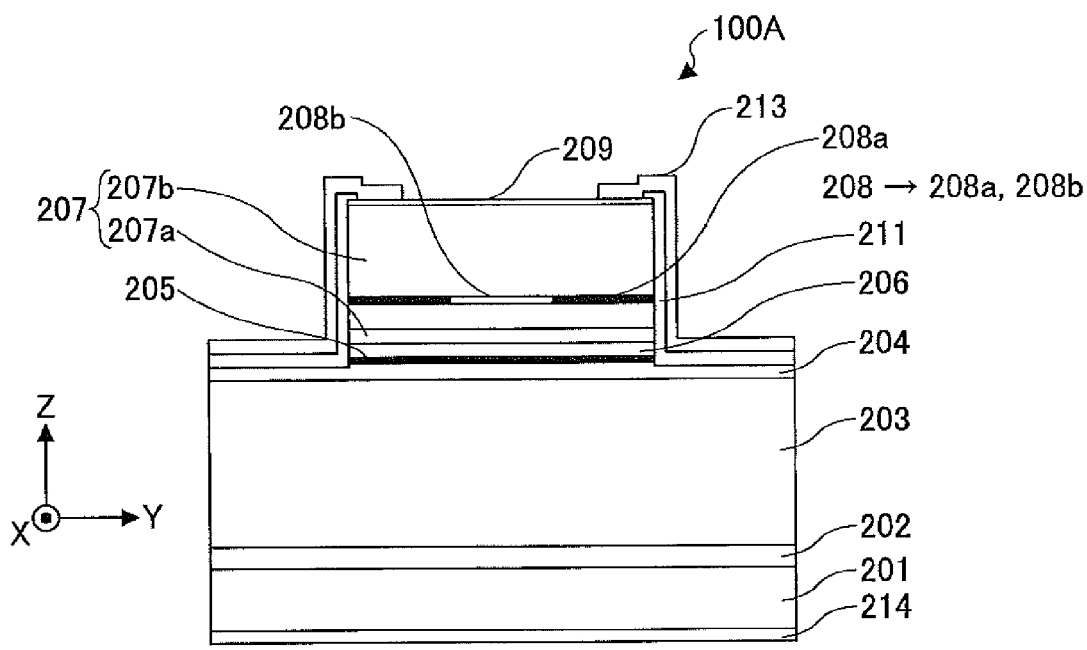
FIG. 28 is a cut-away side view of a surface emitting laser element according to a second embodiment of the present invention.

FIG. 28 is a cut-away side view of a surface emitting laser element 100A according to a second embodiment of the present invention. In the description of the present invention, the laser beam radiating direction is determined to be a Z axis direction, and two directions orthogonal to each other on a surface perpendicular to the Z axis direction are determined to be an X axis direction and a Y axis direction.

A designing oscillation wavelength of the surface emitting laser element 100A is in a 780 nm band. In the surface emitting laser element 100A, plural semiconductor layers such as a buffer layer 202, a lower semiconductor DBR 203, a lower spacer layer 204, an active layer 205, an upper spacer layer 206, an upper semiconductor DBR 207, and a contact layer 209 are sequentially stacked on a substrate 201. In the following, the above semiconductor layer stacked structure is called a third layer stacked body.

The substrate 201 is formed of an n-GaAs single crystal, and is an inclined substrate in which the normal direction of the main surface is inclined in the [111] A direction by 15 degrees relative to the [100] direction.

The buffer layer is formed of n-GaAs.

The lower semiconductor DBR 203 includes 40.5 pairs of a low refractive index layer formed of n-AlAs and a high refractive index layer formed of n-$Al_{0.3}Ga_{0.7}As$. In addition, in order to decrease an electric resistance value, a composition gradient layer of 20 nm thickness is formed between the low refractive index layer and the high refractive index layer in which the composition is gradually changed from one composition to the other composition.

Each of the low and high refractive index layers is determined to have the optical thickness of λ/4 by including ½ of the adjacent composition gradient layers when the oscillation wavelength is λ.

The lower spacer layer 204 is formed of non-doped $(Al_{0.1}Ga_{0.9})_{0.5}In_{0.5}P$.

The active layer 205 includes a quantum well layer formed of GaInAsP and a barrier layer formed of GaInP.

In order to obtain the oscillation wavelength of the 780 nm band, the quantum well layer is formed by introducing As into a GaInP mixed crystal and has compression strain. The barrier layer makes the band gap large by introducing tensile strain, realizes high carrier confinement, and forms a structure to correct the strain of the quantum well layer. The composition of the quantum well layer is determined so that an oscillation wavelength in the CW oscillation threshold current in an edge emitting LD (laser diode) structure becomes equal to a resonance wavelength of a surface emitting laser element. That is, the PL wavelength is adjusted to be 770 nm by considering a difference (approximately 10 nm) from the oscillation wavelength of the edge LD oscillation wavelength.

Since the substrate 201 is the inclined substrate, an anisotropic gain is introduced in the active layer 205, and the polarization direction can be a specific direction. That is, polarization control can be realized.

The upper spacer layer 206 is formed of non-doped $(Al_{0.1}Ga_{0.9})_{0.5}In_{0.5}P$.

A part formed of the lower spacer layer 204, the active layer 205, and the upper spacer layer 206 is called a resonator structural body, and the thickness of the resonator structural body is determined to be the optical thickness of one wavelength. In order to obtain high stimulated emission probability, the active layer 205 is at a center of the resonator structural body which center corresponds to an anti-node position of a standing wave distribution of an electric field. The resonator structural body is sandwiched between the lower semiconductor DBR 203 and the upper semiconductor DBR 207.

The upper semiconductor DBR 207 includes a first upper semiconductor DBR 207a and a second upper semiconductor DBR 207b.

The first upper semiconductor DBR 207a includes a pair (first pair) of a low refractive index layer formed of $p-(Al_{0.7}Ga_{0.3})_{0.5}In_{0.5}P$ and a high refractive index layer formed of $p-(Al_{0.1}Ga_{0.9})_{0.5}In_{0.5}P$. The first upper semiconductor DBR 207a has larger band gap energy than the AlGaAs layer has, and functions as a block layer for blocking electrons injected into an active region.

Since the substrate 201 is an inclined substrate, the substrate 201 prevents generating hillocks in the AlGaInP material, can increase a crystalline property, prevents generating a natural superlatice, and prevents decreasing band gap energy. Therefore, the first upper semiconductor DBR 207a can maintain the band gap energy at a high level, and sufficiently functions as the blocking layer against the electrons.

The second upper semiconductor DBR 207b includes 23 pairs (second pairs) of a low refractive index layer formed of $p-Al_{0.9}Ga_{0.1}AS$ and a high refractive index layer formed of $p-Al_{0.3}Ga_{0.7}As$.

In order to decrease an electric resistance value, in the upper semiconductor DBR 207, a composition gradient layer of 20 nm thickness is formed between the low refractive index layer and the high refractive index layer in which the composition is gradually changed from one composition to the other composition. Each of the low and high refractive index layers is determined to have an optical thickness of λ/4 by including ½ of the adjacent composition gradient layers when the oscillation wavelength is λ.

The contact layer 209 is formed of p-GaAs.

Next, a manufacturing method of the surface emitting laser element 100A is simply described.

(2-1): The third layer stacked body is formed by crystal growth with the use of an MOCVD method or an MBE method. At this time, a layer to be selectively oxidized 208 of 30 nm thickness formed of p-AlAs is inserted at a position of a node of a standing wave from a third position from the active layer 205 (the third pair from the resonator structural body) which position is in the middle of the second upper semiconductor DBR 207b.

In this, as a raw material of III group, TMA, TMG, or TMI is used, and as a raw material of V group, an arsine ($AsH_3$) gas is used. In addition, as a raw material of p-type dopant, carbon tetrabromide ($CBr_4$) is used, and as a raw material of n-type dopant, hydrogen selenide ($H_2Se$) is used. In addition, as a V group P raw material of AlGaInAsP based material, a phosphine ($PH_3$) gas is used, and as a p-type dopant raw material of AlGaInP material, dimethyl zinc (DMZn) is used.

Figure 29:
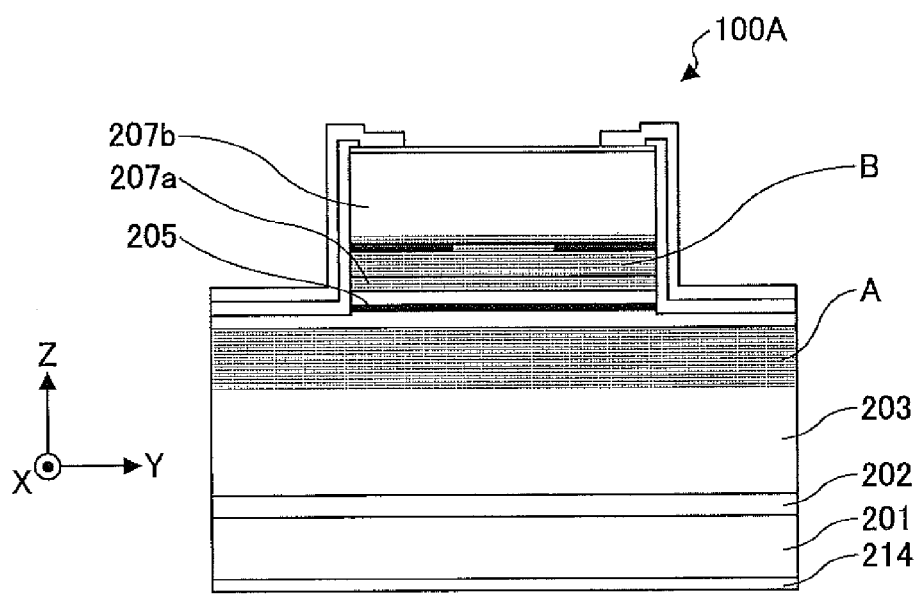
FIG. 29 is a cut-away side view of the surface emitting laser element according to the second embodiment of the present invention in which low doping concentration regions are shown.

In addition, in plural layers in the lower semiconductor DBR 203 near the resonator structural body (A region in FIG. 29), the doping concentration of n-type dopant is adjusted to be relatively lower than that in the other regions.

Specifically, in the lower semiconductor DBR 203, the 4 pairs from a region contacting the lower spacer layer 204 are the low concentration regions relative to the remaining 37.5 pairs. In the specific doping concentration, in the low doping concentration region, the doping concentration of the composition constant layers (the refractive index layers) and a part corresponding to the anti-node of the standing wave is determined to be within 3 to $7.5 \times 10^{17}$ cm$^{-3}$, and the doping concentration of a part corresponding to the node of the standing wave is determined to be within $3 \times 10^{17}$ to $1 \times 10^{18}$ cm$^{-3}$. In the remaining 37.5 pairs, the doping concentration of the composition constant layers (the refractive index layers) and a part corresponding to the anti-node of the standing wave is determined to be within 1 to $3 \times 10^{18}$ cm$^{-3}$, and the doping concentration of a part corresponding to the node of the standing wave is determined to be within 1 to $5 \times 10^{18}$ cm$^{-3}$.

In addition, in plural layers in the first upper semiconductor DBR 207a and the second upper semiconductor DBR 207b near the resonator structural body (B region in FIG. 29), the doping concentration of p-type dopant is adjusted to be relatively lower than that in the other regions.

Specifically, in the upper semiconductor DBR 207, the 4 pairs from a region contacting the upper spacer layer 206 are the low concentration regions relative to the remaining 20 pairs. In the specific doping concentration, in the low doping concentration region, the doping concentration of the composition constant layers (the refractive index layers) and a part corresponding to the anti-node of the standing wave is determined to be within approximately 2 to $1.3 \times 10^{18}$ cm$^{-3}$, and the doping concentration of a part corresponding to the node of the standing wave is determined to be within $2 \times 10^{17}$ to $4 \times 10^{18}$ cm$^{-3}$. In the remaining 20 pairs, the doping concentration of the composition constant layers (the refractive index layers) and a part corresponding to the anti-node of the standing wave is determined to be within $1 \times 10^{18}$ to $1.5 \times 10^{18}$ cm$^{-3}$, and the doping concentration of a part corresponding to the node of the standing wave is determined to be within $4 \times 10^{18}$ cm$^{-3}$.

(2-2): A resist pattern having a square of 25 µm sides is formed on a surface of the third layer stacked body.

(2-3): A mesa having a quadrangular prism shape is formed by ECR (electron cyclotron resonance) etching with the use of a $Cl_2$ gas while using the square-shaped resist pattern as a photo-mask. In this, the bottom surface of the etching is positioned in the lower spacer layer 204.

(2-4): The photo-mask is removed.

(2-5): A part of the layer to be selectively oxidized 208 in the mesa is selectively oxidized by applying heat to the third layer stacked body while being in water vapor. With this, a non-oxidized region 208b surrounded by an oxidized layer 208a remains at the center part of the mesa. Consequently, an oxide confinement structure is formed in which a driving current route of a light emitting part of the surface emitting laser element 100A is confined to the center part of the mesa. The non-oxidized region 208b is a current passing region (current injection region) and one side of the current passing region is 4 µm.

(2-6): A protection layer 211 of $SiO_2$ is formed by using a CVD (chemical vapor deposition) method.

(2-7): A window for a p-electrode contact is opened at the upper part of the mesa. In this, a mask of photoresist is formed, a part of the photoresist is removed by exposing an opening part at the upper part of the mesa, and the window is opened by etching the protection layer 211 with the use of BHF.

(2-8): A resist pattern of a square shape of 10 µm sides is formed at a region which becomes a light emitting part at the upper part of the mesa, and a p-electrode material is deposited by vapor deposition. As the p-electrode material, a multi-layered film formed of Cr/AuZn/Au or Ti/Pt/Au is used.

(2-9): A p-electrode 213 is formed by lifting off the electrode material at the light emitting part.

(2-10): The bottom surface of the substrate 201 is polished so that the thickness of the substrate 201 becomes, for example, 100 µm, and an n-electrode 214 is formed on the bottom surface of the substrate 201. The n-electrode 214 is formed of a multi-layered film of AuGe/Ni/Au.

(2-11): Ohmic contact between the p-electrode 213 and the n-electrode 214 is obtained by annealing. With this the mesa becomes the light emitting part.

(2-12): The surface emitting laser element 100A is formed as a chip by being cut off.

When a rectangular current pulse whose pulse period is 1 ms and whose pulse width is 500 µs is supplied to the surface emitting laser element 100A, the droop rate is −1%.

In addition, in the surface emitting laser element 100A, the light confinement coefficient of the fundamental lateral mode at room temperature is 0.978.

As described above, in order to prevent the negative droop characteristics in the surface emitting laser element having the oxide confinement structure, it is effective that the light confinement coefficient by the oxidized layer is determined to be large so that the light confinement in the lateral mode becomes large against a refractive index change generated by a partial temperature change inside the element.

However, when the light confinement coefficient is made to be large, the light confinement is increased not only for the fundamental lateral mode and also for a high-order lateral mode, and a high-order mode oscillation is likely generated. Therefore, there is a trade-off relationship between the prevention of the negative droop characteristics and the increase of the single mode output.

Figure 30:
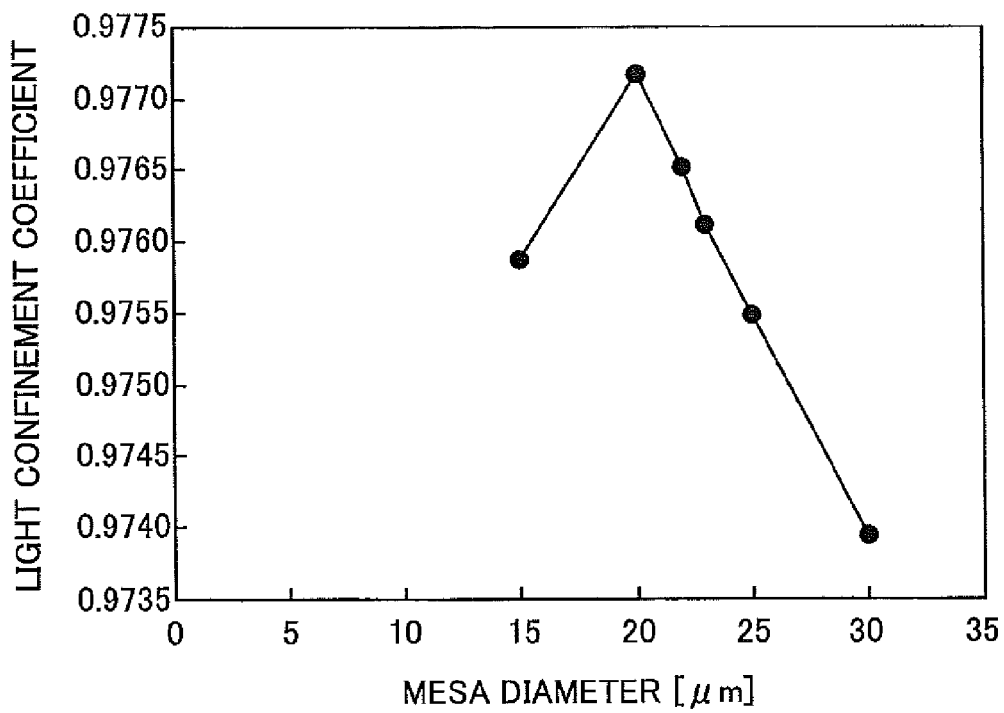
FIG. 30 is a graph showing a relationship between the light confinement coefficient and a mesa diameter in the fundamental lateral mode.
Figure 31:
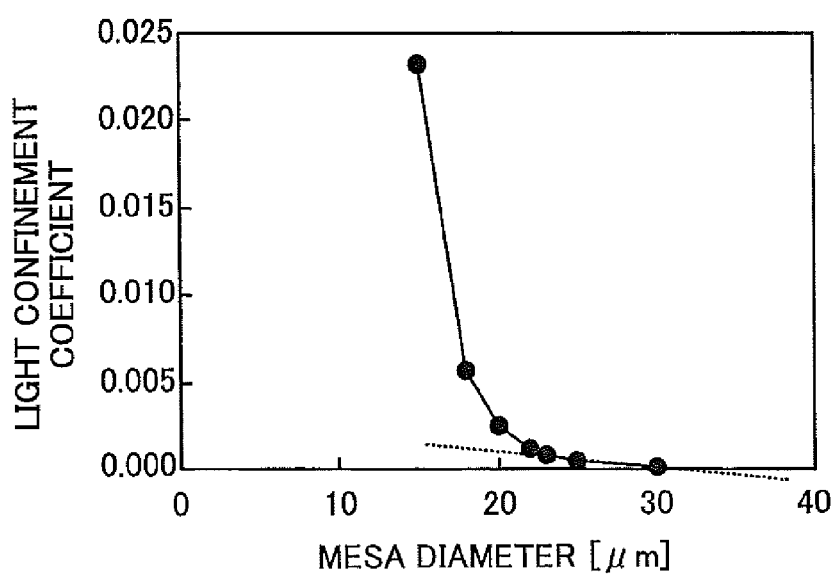
FIG. 31 is a graph showing a relationship between the light confinement coefficient and the mesa diameter in a first-order lateral mode.

In a surface emitting laser element whose oscillation wavelength is in the 780 nm band, a relationship between the light confinement coefficient and the diameter of the mesa of the fundamental (0-order) lateral mode is shown in FIG. 30, and a relationship between the light confinement coefficient and the diameter of the mesa of the first-order lateral mode which is one of the high-order lateral modes is shown in FIG. 31. In FIGS. 30 and 31, the layer to be selectively oxidized 208 of 30 nm thickness is at the third pair from the resonator structural body in the semiconductor DBR and at the node of the standing wave distribution. In addition, the oxide confinement diameter is 4 µm, the temperature of the surface emitting laser element 100A is room temperature in all regions.

Figure 32:
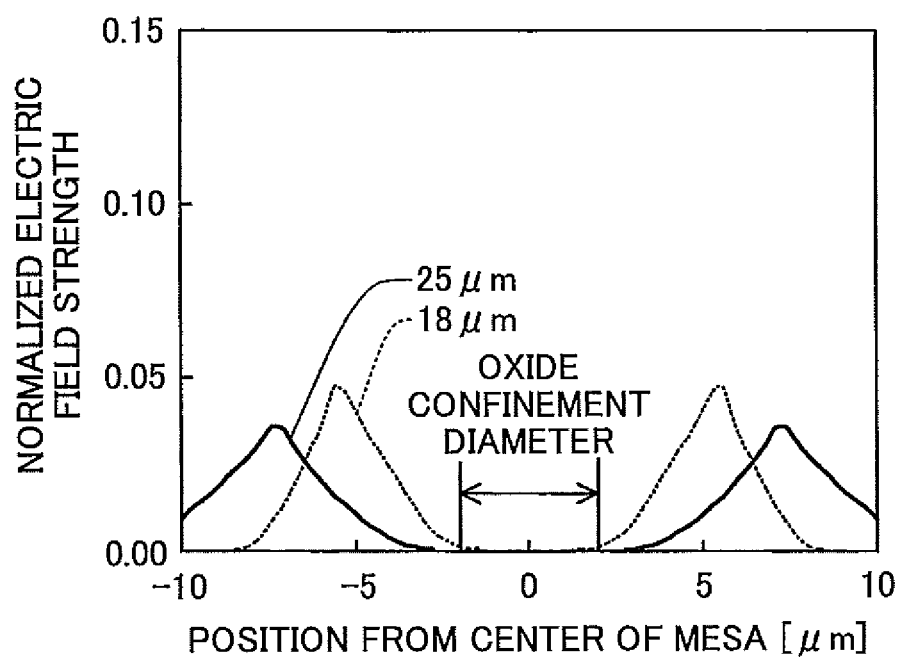
FIG. 32 is a graph showing electric field strength of the first-order lateral mode when the diameter of the mesa is changed.

As shown in FIG. 30, since the thickness of the layer to be selectively oxidized 208 is 30 nm, the light confinement coefficient of the fundamental lateral mode is 0.9 or more in the range where the mesa diameter is 15 to 30 µm, and the negative droop characteristics can be effectively prevented. In addition, as shown in FIG. 31, when the mesa diameter is increased, the light confinement coefficient is lowered. Since an orthogonal relationship exists between the first-order lateral mode and the fundamental lateral mode, when the size of the mesa is increased, in the first order lateral mode, a special overlap with the fundamental lateral mode (special overlap with the current injection region) can be decreased. FIG. 32 is a graph showing a relationship between normalized electric field strength and the size of the mesa (mesa diameter) in the first-order lateral mode. In FIG. 32, two cases are shown in which the mesa diameter is 18 µm and 25 µm. As shown in FIG. 32, when the mesa diameter is increased, the electric field strength distribution is shifted to a circumferential side of the mesa.

The light confinement coefficient of the first-order lateral mode is an index which shows the oscillation ability of the first-order lateral mode, and when the value of the light confinement coefficient is small, the first-order lateral mode is hardly oscillated. Therefore, when the mesa diameter is increased, the oscillation of the first-order lateral mode is prevented and the single mode output is increased.

In addition, as shown in FIG. 31, the light confinement coefficient of the first-order lateral mode is decreased when the diameter of the mesa is increased; however, when the diameter of the mesa is 22 µm or more, the light confinement coefficient shows a saturated state. That is, the diameter of the mesa of 22 µm has significance in that the behavior of the first-order lateral mode is greatly changed. Therefore, when the mesa has a column shape and the diameter is determined to be 22 µm or more, and when the mesa has a square prism shape and the side is determined to be 22 µm or more, the oscillation of the first-order lateral mode can be effectively prevented. At this time, the light confinement coefficient of the fundamental lateral mode is maintained to be 0.9 or more (see FIG. 30). Therefore, the single mode output can be increased while preventing the negative droop characteristics.

As described above, the negative droop characteristics are generated by a reason in which the temperature of the center part of the mesa is partially changed. Therefore, a first method to prevent the negative droop characteristics is to increase the light confinement coefficient at room temperature and to increase the stability of the lateral mode distribution against the partial temperature change at the center part of the mesa. In addition, a second method is to prevent the partial temperature rise at the center part of the mesa.

In the second method, specifically, the heat generation inside the surface emitting laser element is decreased by increasing the power converting efficiency of the surface emitting laser element. In a semiconductor material, free carrier absorption exists and is a factor to decrease the power conversion efficiency. Light energy absorbed by the free carrier absorption becomes kinetic energy of carriers, is finally converted into lattice vibration energy, and the free carrier absorption increases the temperature near the center part of the mesa. The free carrier absorption depends on the electric field strength and the carrier concentration of the light, and the free carrier absorption is remarkably generated when the carrier concentration is high and the electric field strength is high.

The electric field strength of the oscillation light in the surface emitting laser element is high near the active layer and is gradually decreased at a position separated from the active layer. When the free carrier absorption occurs at a position where the electric field strength is high, the power conversion efficiency is greatly decreased and more heat is generated.

In addition, when the free carrier absorption is large, in order to compensate for the decrease of the light output caused by the absorption of the light energy, the current injection into the active layer must be large, and as a result, the amount of heat generated is increased and the internal temperature of the surface emitting laser element is further increased.

In order to solve the above problem, when the doping concentration, in the region where the electric field strength is large and is adjacent to the resonator structural body of the semiconductor DBR, is determined to be the low concentration relative to the other regions, the free carrier absorption is decreased and the power conversion efficiency of the surface emitting laser element can be increased. As a result, the partial temperature rise inside the surface emitting laser element can be decreased and the causes of generating the negative droop characteristics such as the change of the fundamental lateral mode distribution and the change of the detuning amount can be decreased.

The surface emitting laser element having the oxide confinement structure limits the current injection region of the active layer to be a relatively small region by the oxidized layer; therefore, the current passing through region of the oxide confinement structure is likely to have a high resistance value. In addition, the current passing through region inevitably has the special overlapping region with the light emitting region; therefore, heat is generated in the current passing region caused by the current injection and the temperature likely rises at the light emitting region of the center part of the mesa. As described above, the temperature rise is the cause of generating the negative droop characteristics.

The inventors of the present invention have studied the element structure having the low negative droop characteristics with high reliability for a long time in detail by considering the light confinement coefficient of the fundamental lateral mode, the heat generation inside the element, and the influence of the stress of the oxidized layer. As a result, the inventors have found that the effect is high when the position of the layer to be selectively oxidized is at the third pair or the fourth pair in the semiconductor DBR from the resonator structural body (the third or the fourth node from the active layer in the standing wave distribution).

The oxidized layer in the oxide confinement structure has a function to perform current confinement and light confinement at the same time; therefore, the oxidized layer has an advantage when the oxidized layer is positioned near the active layer so that the low threshold current is realized. When the oxidized layer is near the active layer, the light confinement coefficient can be large; therefore, the negative droop characteristics can be effectively prevented.

The inventors have found that the surface emitting laser element does not have high reliability in the long run when the position of the layer to be selectively oxidized is at the first pair or the second pair from the resonator structural body. Generally, the volume of the layer to be selectively oxidized is reduced in the selectively oxidizing process. In addition, the oxide confinement structure has a high resistance value and generates heat when the current is supplied. When the layer to be selectively oxidized is at the first or second pair from the resonator structural body, the stress caused by the contraction of the layer to be selectively oxidized and the heat from the oxide confinement structure may influence the active layer. In this case, the dislocation and multiplication in the active layer are remarkably generated and the service life of the surface emitting laser element is shortened.

On the other hand, the inventors have found that the service life of the surface emitting laser element becomes remarkably long and has sufficient reliability in the long run when the position of the layer to be selectively oxidized is at the third pair or the fourth pair from the resonator structural body.

However, when the position of the layer to be selectively oxidized is at the fifth pair from the resonator structural body, the threshold current becomes large, the input power becomes high, the heat generated inside the surface emitting laser element is increased, and the negative droop characteristics becomes slightly large.

As described above, the inventors of the present invention have found that the decrease of the negative droop characteristics and the high reliability can be realized at the same time when the position of the layer to be selectively oxidized is at the third or fourth pair from the resonator structural body.

As described above, the surface emitting laser element 100A according to the second embodiment of the present invention includes the resonator structural body including the active layer 205, and the lower semiconductor DBR 203 and the upper semiconductor DBR 207 sandwich the resonator structural body. The upper semiconductor DBR 207 includes the oxide confinement structure. In the oxide confinement structure, the oxidized layer 208a including at least an oxide formed by oxidizing a part of the layer to be selectively oxidized 208 containing Al surrounds the current passing through region 208b, and the injection current and the lateral mode of the oscillation light are confined at the same time. In addition, the thickness of the layer to be selectively oxidized 208 is 30 nm, and the droop (rate) $(P1-P2)/P2=-0.01$ when the rectangular pulse whose pulse period is 1 ms and whose pulse width is 500 μs is supplied. With this, the negative droop characteristics can be prevented regardless of the pulse period.

In addition, in the surface emitting laser element 100A, a part of the upper semiconductor DBR 207 adjacent to the resonator structural body is caused to have a low doping concentration. The electric field strength in the upper semiconductor DBR 207 is caused to be a half near the fourth pair from the active layer 205. When the doping concentration of the region having the high electric field strength is determined to be the low concentration, the free carrier absorption can be decreased, the oscillation threshold current is decreased, the slope efficiency is increased; therefore, the driving current can be decreased. That is, since the input power can be low, the heat generated is decreased. Therefore, the negative droop characteristics can be further prevented.

In addition, the doping concentrations can be different from each other between the composition constant layers (the refractive index layers) and a part corresponding to the antinode of the standing wave distribution. In addition, in the low doping concentration regions, the doping concentrations of the pairs can be different from each other within the above region. For example, in the low doping concentration regions, when a part whose electric field strength is high near the spacer layer is a region whose doping concentration is lower than the low concentration, the free carrier absorption can be effectively decreased.

In addition, in the surface emitting laser element 100A, the length of one side of the cross section of the mesa perpendicular to the laser oscillating direction is 25 μm; therefore, the single mode output can be high 2 mW.

In addition, in the surface emitting laser element 100A, the layer to be selectively oxidized 208 is disposed in the upper semiconductor DBR 207 at the third pair from the resonator structural body. With this, while a practical threshold current is maintained, a part where heat is generated by a high resistance value caused by current confinement is separated from the active layer 205, the thermal resistance is decreased, and the partial heat generated at the center part of the mesa can be decreased. In addition, an influence of distortion in the oxidized layer 208a on the active layer 205 can be decreased, and the surface emitting laser element 100A can have long service life and high reliability in the long run. The layer to be selectively oxidized 208 can be positioned in the upper semiconductor DBR 207 at the fourth pair from the resonator structural body.

[Third Embodiment]

Figure 33:
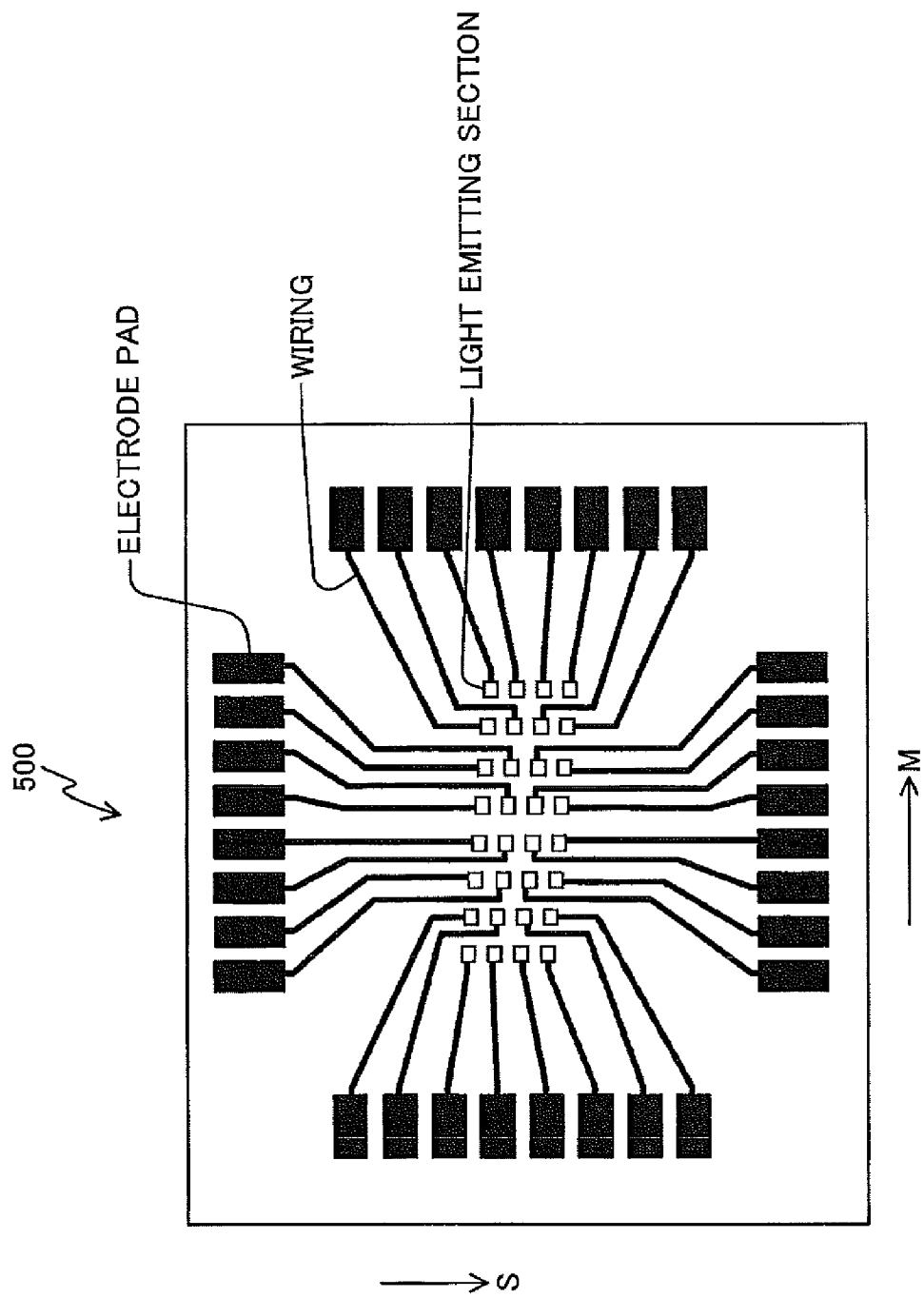
FIG. 33 is a diagram showing a surface emitting laser array according to a third embodiment of the present invention.

FIG. 33 is a diagram showing a surface emitting laser array 500 according to a third embodiment of the present invention.

In the surface emitting laser array 500, plural light emitting sections are disposed on a substrate. In FIG. 33, 32 light emitting sections are disposed. In FIG. 33, the right direction of the paper is the +M direction and the lower direction of the paper is the +S direction.

Figure 34:
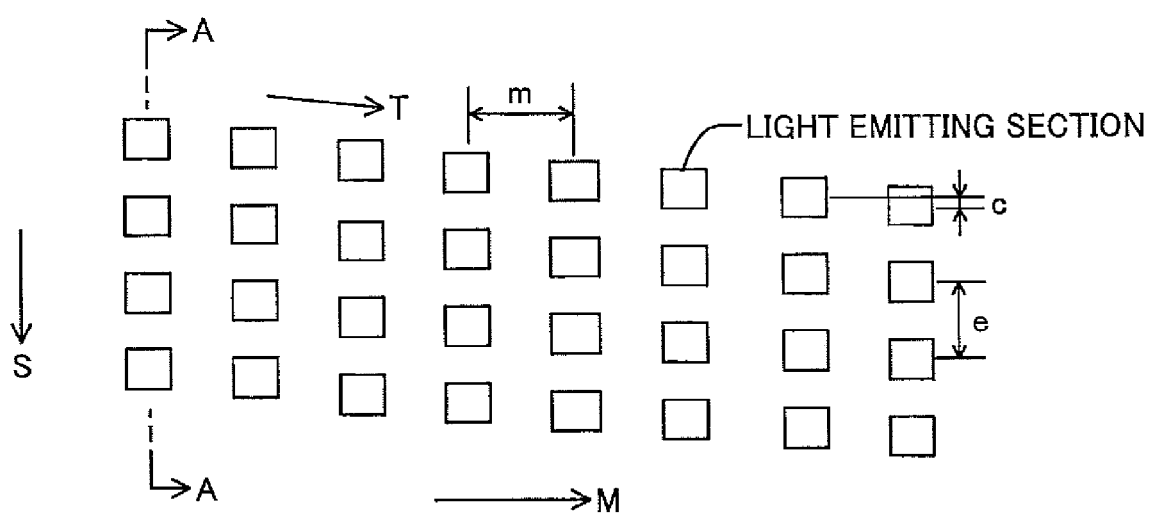
FIG. 34 is a diagram showing a two-dimensional arrangement of light emitting sections shown in FIG. 33.

As shown in FIG. 34, the surface emitting laser array 500 includes four light emitting section arrays in which eight light emitting sections are disposed with the same interval between the light emitting sections in the T direction having a tilt angle α (0°<α<90°) from the M direction toward the S direction. The eight light emitting sections in one array are disposed so that the interval in the S direction between the centers of the eight light emitting sections is "c" and the four light emitting section arrays are disposed so that the interval in the S direction between the four light emitting section arrays is "e" (distance between the centers of the two light emitting section arrays). That is, the 32 light emitting sections are two-dimensionally arrayed.

In FIG. 34, the interval "c" is 3 μm, the interval "e" is 24 μm, and the interval "m" between the light emitting sections in the M direction is 30 μm.

Figure 35:
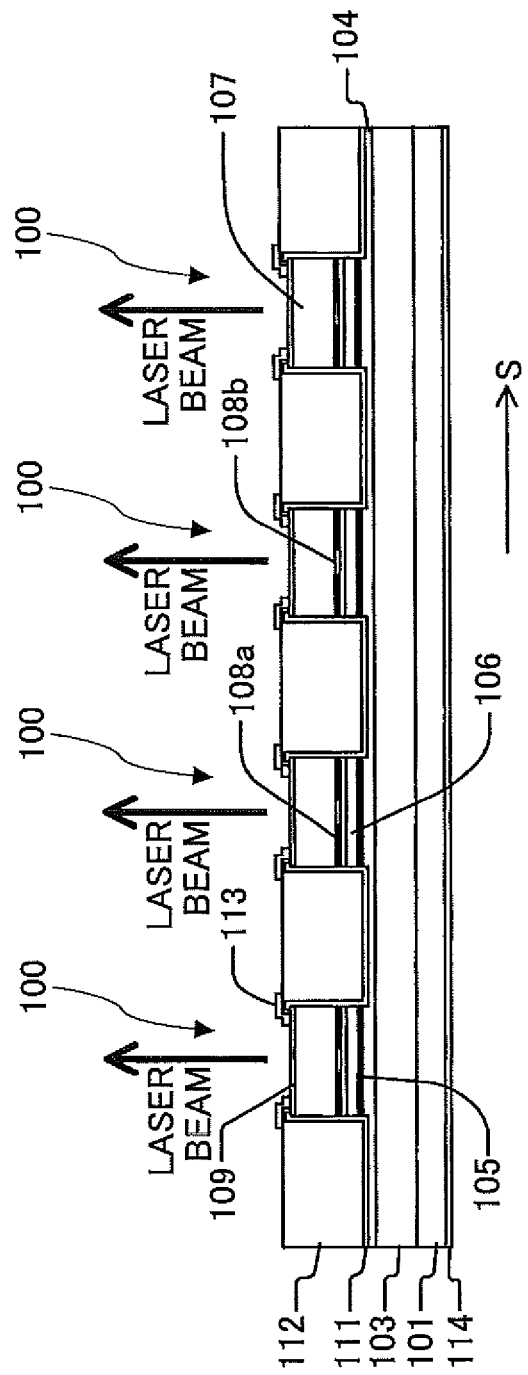
FIG. 35 is a cut-away side view along line A-A of FIG. 34.

FIG. 35 is a cut-away side view along line A-A of FIG. 34. As shown in FIG. 35, the light emitting section has the same structure as that shown in FIG. 1. That is, the light emitting section is the light emitting laser element 100. That is, the surface emitting laser array 500 can be manufactured by a method similar to the manufacturing method of the surface emitting laser element 100.

The surface emitting laser array 500 according to the third embodiment of the present invention is formed of the surface emitting laser elements 100. Therefore, the surface emitting laser array 500 can have the same effects as the effects of the surface emitting laser element 100.

In the surface emitting laser array 500, the distance (groove) between the two adjacent light emitting sections (the surface emitting laser elements 100) is preferably 5 μm or more so that the light emitting sections are electrically and spatially separated from each other. When the distance is too small, etching is not easily controlled when the surface emitting laser array 500 is manufactured. In addition, the size of the mesa (the length of one side) is preferably 10 μm or more. When the length is too short, heat stays inside the surface emitting array 500 and the characteristics may be lowered.

In the third embodiment of the present invention, the number of the light emitting sections is 32. However, the number is not limited to 32 and can be less than 32 or more than 32.

In addition, in the surface emitting laser array 500 according to the third embodiment of the present invention, the surface emitting laser elements 100A according to the second embodiment of the present invention can be used instead of using the surface emitting laser elements 100.

In addition, in the first through third embodiments of the present invention, the shape of the mesa in the direction perpendicular to the laser oscillating direction is a square or a circle. However, the shape is not limited to a square or a circle, and can be an arbitrary shape such as an ellipse or a rectangle.

In addition, in the first through third embodiments of the present invention, the oscillation wavelength of the light emitting section is in the 780 nm band. However, the wavelength band is not limited to 780 nm, and can be, for example, 650 nm, 850 nm, 980 nm, 1.3 μm, and 1.5 μm.

[Fourth Embodiment]

Figure 36:
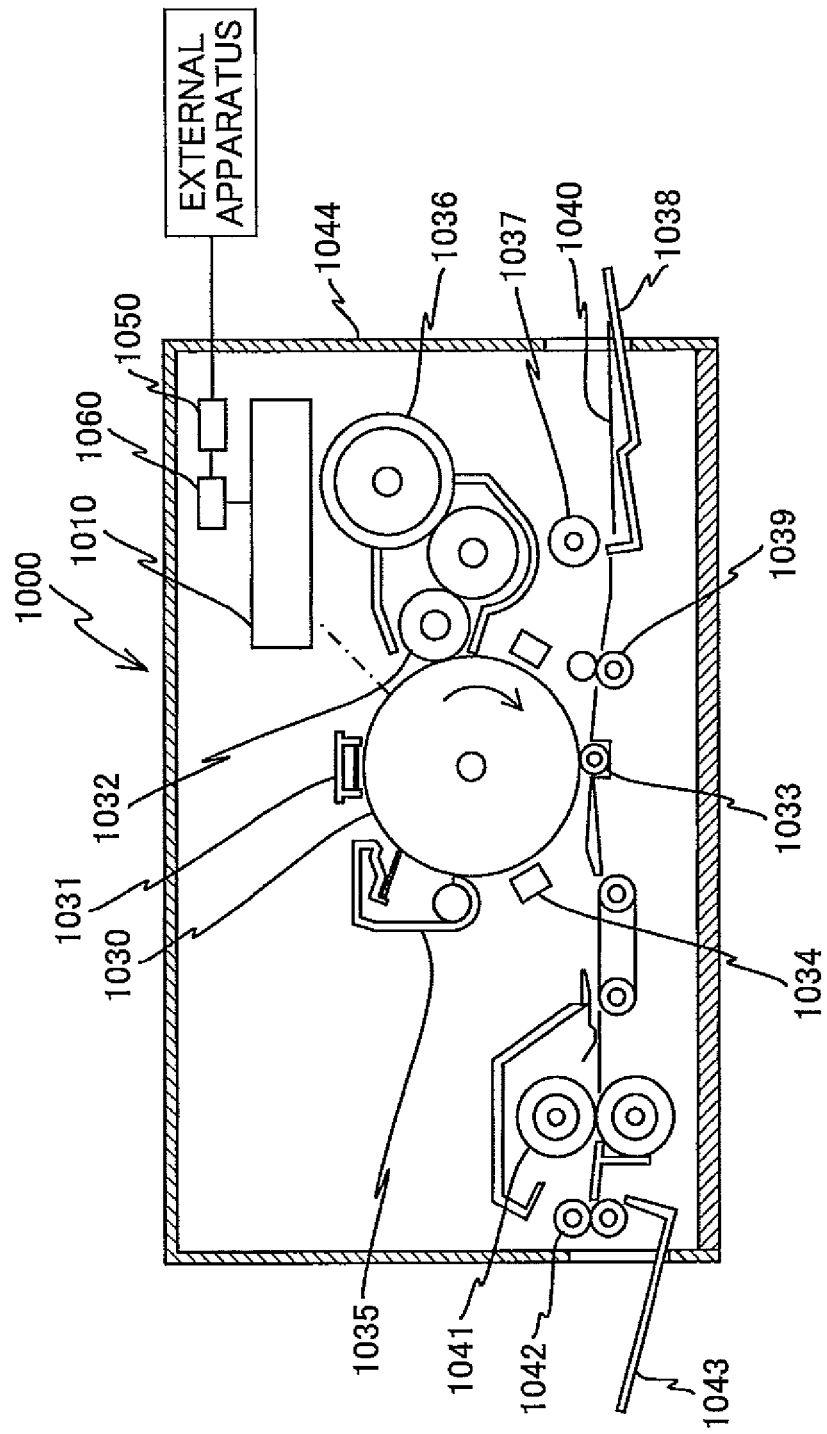
FIG. 36 is a cut-away side view of an image forming apparatus according to a fourth embodiment of the present invention.

FIG. 36 is a cut-away side view of an image forming apparatus according to a fourth embodiment of the present invention. In FIG. 36, as the image forming apparatus, a laser printer 1000 is shown.

As shown in FIG. 36, the laser printer 1000 includes an optical scanning device 1010, a photoconductor drum 1030 (image carrier), a charger 1031, a developing roller 1032, a transfer charger 1033, a discharging unit 1034, a cleaning unit 1035, a toner cartridge 1036, a paper feeding roller 1037, a paper feeding tray 1038, a pair of registration rollers 1039, fixing rollers 1041, paper outputting rollers 1042, a paper outputting tray 1043, a communication controller 1050, and a printer controller 1060 for totally controlling the above elements at corresponding predetermined positions in a printer cabinet 1044.

The communication controller 1050 controls interactive communications with an external apparatus (for example, a personal computer) via, for example, a network.

The photoconductor drum 1030 is a cylinder-shaped member and a photoconductor layer is formed on the surface of the photoconductor drum 1030. That is, the surface of the photoconductor drum 1030 is a surface to be scanned. The photoconductor drum 1030 is rotated in the arrow direction shown in FIG. 36.

The charger 1031, the developing roller 1032, the transfer charger 1033, the discharging unit 1034, and the cleaning unit 1035 are disposed near the surface of the photoconductor drum 1030. The charger 1031, the developing roller 1032, the transfer charger 1033, the discharging unit 1034, and the cleaning unit 1035 are sequentially disposed along the rotating direction of the photoconductor drum 1030 in this order.

The charger 1031 uniformly charges the surface of the photoconductor drum 1030.

The optical scanning device 1010 radiates a light beam (light flux) modulated based on image information transmitted from the external apparatus onto the surface of the photoconductor drum 1030. With this, an electrostatic latent image based on the image information is formed onto the surface of the photoconductor drum 1030. The formed electrostatic latent image is moved to the developing roller 1032 corresponding to the rotation of the photoconductor drum 1030. The optical scanning device 1010 is described below in detail.

Toners are stored in the toner cartridge 1036 and the stored toners are supplied to the developing roller 1032.

The developing roller 1032 adheres the toners supplied from the toner cartridge 1036 onto the electrostatic latent image formed on the surface of the photoconductor drum 1030. With this, the electrostatic latent image is developed and the image information is caused to appear. The electrostatic latent image on which the toners are adhered (toner image) is moved to the transfer charger 1033 corresponding to the rotation of the photoconductor drum 1030.

Recording paper 1040 is stored in the paper feeding tray 1038. The paper feeding roller 1037 is disposed near the paper feeding tray 1038, the paper feeding roller 1037 picks up the recording paper 1040 one by one from the paper feeding tray 1038, and transports the picked up recording paper 1040 to the pair of the registration rollers 1039. The pair of the registration rollers 1039 temporarily holds the recording paper 1040 picked up by the paper feeding roller 1037 and transports the recording paper 1040 to a position between the photoconductor drum 1030 and the transfer charger 1033 corresponding to the rotation of the photoconductor drum 1030.

A voltage whose polarity is reverse to the polarity of the toners is applied onto the transfer charger 1033 so that the toner image on the photoconductor drum 1030 is electrically attracted onto the recording paper 1040. The toner image on the surface of the photoconductor drum 1030 is transferred onto the recording paper 1040 by the voltage. The recording paper 1040 onto which the toner image is transferred is transported to the fixing roller 1041.

Heat and pressure are applied to the recording paper 1040 by the fixing rollers 1041. With this, the toner image on the recording paper 1040 is fixed. The recording paper 1040 on which the toner image is fixed by the fixing rollers 1041 is transported to the paper outputting tray 1043 via the paper outputting rollers 1042, and the recording paper 1040 is stacked on the paper outputting tray 1043.

The discharging unit 1034 discharges the surface of the photoconductor drum 1030.

The cleaning unit 1035 removes the toners remaining on the surface of the photoconductor drum 1030 and the surface of the photoconductor drum 1030 returns to a position to face the charger 1031.

Next, a structure of the optical scanning device 1010 is described.

Figure 37:
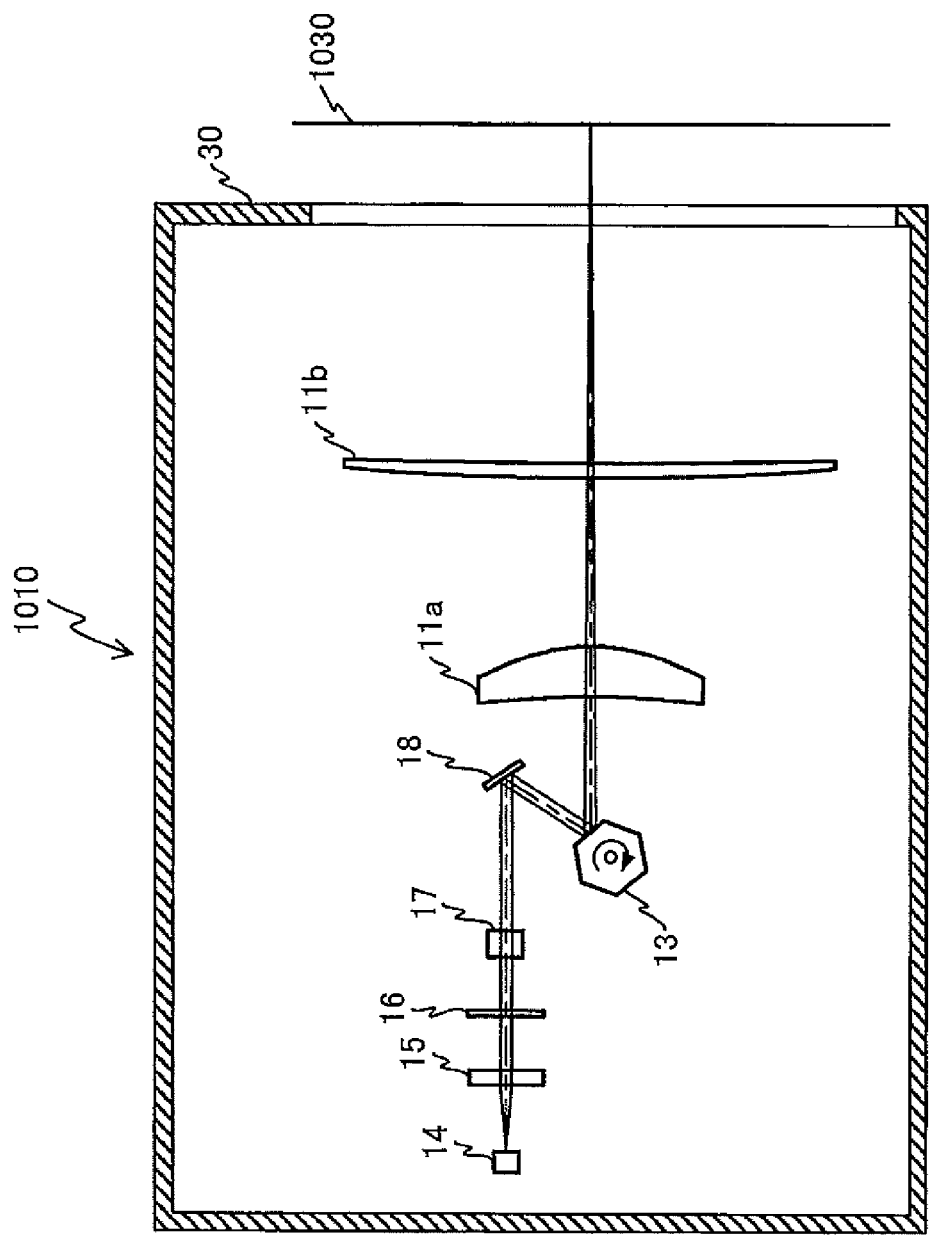
FIG. 37 is a cut-away side view of an optical scanning device shown in FIG. 36.

As shown in FIG. 37, as an example, the optical scanning device 1010 includes a scanning lens at a deflector side 11*a*, a scanning lens at an image face side 11*b*, a polygon mirror 13, a light source 14, a coupling lens 15, an aperture plate 16, an anamorphic lens 17, a reflection mirror 18, and a scanning controller (not shown) at corresponding predetermined positions in housing 30.

In the following, the direction corresponding to the main scanning is called the main scanning corresponding direction and the direction corresponding to the sub scanning is called the sub scanning corresponding direction.

As an example, the light source 14 includes the surface emitting laser array 500 and can output 32 light beams at the same time. In the surface emitting laser array 500, the M direction is equal to the main scanning corresponding direction and the S direction is equal to the sub scanning corresponding direction shown in FIG. 33.

The coupling lens 15 causes the light beams output from the light source 14 to be weak diverging light.

The aperture plate 16 includes an aperture section and controls the beam diameter of the light beams via the coupling lens 15.

The anamorphic lens 17 forms an image near the deflection reflection surface of the polygon mirror 13 from the light beams passed through the aperture section of the aperture plate 16 via the reflection mirror 18 in the sub scanning corresponding direction.

An optical system disposed on an optical route between the light source 14 and the polygon mirror 13 is called an optical system before deflector. In the fourth embodiment of the present invention, the optical system before deflector is formed of the coupling lens 15, the aperture plate 16, the anamorphic lens 17, and the reflection mirror 18.

The polygon mirror 13 has a six-sided mirror whose inscribing circle radius is, for example, 18 mm and each mirror is a deflection reflection surface. The polygon mirror 13 moves at a constant speed around an axle parallel to the sub scanning corresponding direction and deflects a light beam from the reflection mirror 18.

The scanning lens at deflector side 11*a* is in the optical route of the light beam deflected by the polygon mirror 13.

The scanning lens at image face side 11*b* is in the optical route from the scanning lens at deflector side 11*a*. The light beam from the scanning lens at image face side 11*b* is transmitted onto the surface of the photoconductor drum 1030, and a light spot is formed on the surface of the photoconductor drum 1030. The light spot moves in the long length direction of the photoconductor drum 1030 corresponding to the rotation of the polygon mirror 13. That is, the light spot scans the surface of the photoconductor drum 1030. The moving direction of the light spot is the main scanning direction, and the rotation direction of the photoconductor drum 1030 is the sub scanning direction.

An optical system on an optical route between the polygon mirror 13 and the photoconductor drum 1030 is called a scanning optical system. In the fourth embodiment of the present invention, the scanning optical system is formed of the scanning lens at deflector side 11*a* and the scanning lens at image face side 11*b*. In this, at least one optical axis folding mirror can be disposed on at least one of the optical route between the scanning lens at deflector side 11*a* and the scanning lens at image face side 11*b* and the optical route between the scanning lens at image face side 11*b* and the photoconductor drum 1030.

In the surface emitting laser array 500, the interval "c" between the light emitting sections is constant when each of the light emitting sections is normally projected on a virtual line extending in the sub scanning corresponding direction; therefore, when light emitting timing of the light emitting sections is adjusted, it can be said that the light emitting sections are virtually arrayed with the same interval on the photoconductor drum 1030 in the sub scanning direction.

In addition, since the interval "c" is 3 μm, when the magnification of the optical system of the optical scanning device 1010 is determined to be approximately 1.8 times, high density writing of 4800 dpi (dot per inch) can be performed. When the number of the light emitting sections is increased in the main scanning corresponding direction, an array arrangement is performed in which the interval "c" is further decreased by narrowing the interval "e", or the magnification of the optical system is decreased; further high density writing can be performed, and higher quality printing can be performed. In this, the writing interval in the main scanning direction can be easily controlled by adjusting the light emitting timing of the light emitting sections.

In this case, in the laser printer 1000, even if the writing dot density is increased, the printing can be performed without decreasing the printing speed. In addition, when the writing dot density is not changed, the printing speed can be further increased.

As described above, in the optical scanning device 1010 according to the fourth embodiment of the present invention, since the light source 14 includes the surface emitting laser array 500, the optical scanning can be performed with high accuracy.

In addition, since the laser printer 1000 according to the fourth embodiment of the present invention includes the optical scanning device 1010, a high quality image can be formed.

In the fourth embodiment of the present invention, the light source 14 includes the 32 light emitting sections; however, the number of the light emitting sections is not limited to 32, and can be less than 32 or more than 32.

In addition, in the fourth embodiment of the present invention, the light source 14 includes the surface emitting laser array 500. However, the light source 14 can include a surface emitting laser array formed of the surface emitting laser elements 100A.

In addition, in the fourth embodiment of the present invention, a surface emitting laser array can be used in which the light emitting sections similar to those in the surface emitting laser array 500 are one-dimensionally arrayed, instead of using the surface emitting laser array 500.

In addition, in the fourth embodiment of the present invention, as the image forming apparatus, the laser printer 1000 is used; however, the image forming apparatus is not limited to the laser printer 1000, and can be an image forming apparatus including the optical scanning device 1010. In this case, a high quality image can be formed.

For example, in the fourth embodiment of the present invention, as the image forming apparatus, an image forming apparatus can be used in which laser beams indicating corresponding colors are directly radiated onto a recording medium.

In addition, in the fourth embodiment of the present invention, as the image forming apparatus, an image forming apparatus can be used in which a silver salt film is used. In this case, a latent image is formed on the silver salt film by optical scanning, and the latent image can be visualized by a developing process of a normal silver salt photographic process. Further, the visible image can be printed on photographic printing paper by a printing process of the normal silver salt photographic process. The image forming apparatus can be used as an optical reproduction apparatus or an optical image forming apparatus which shows a CT (computerized tomography) scanned image.

Figure 38:
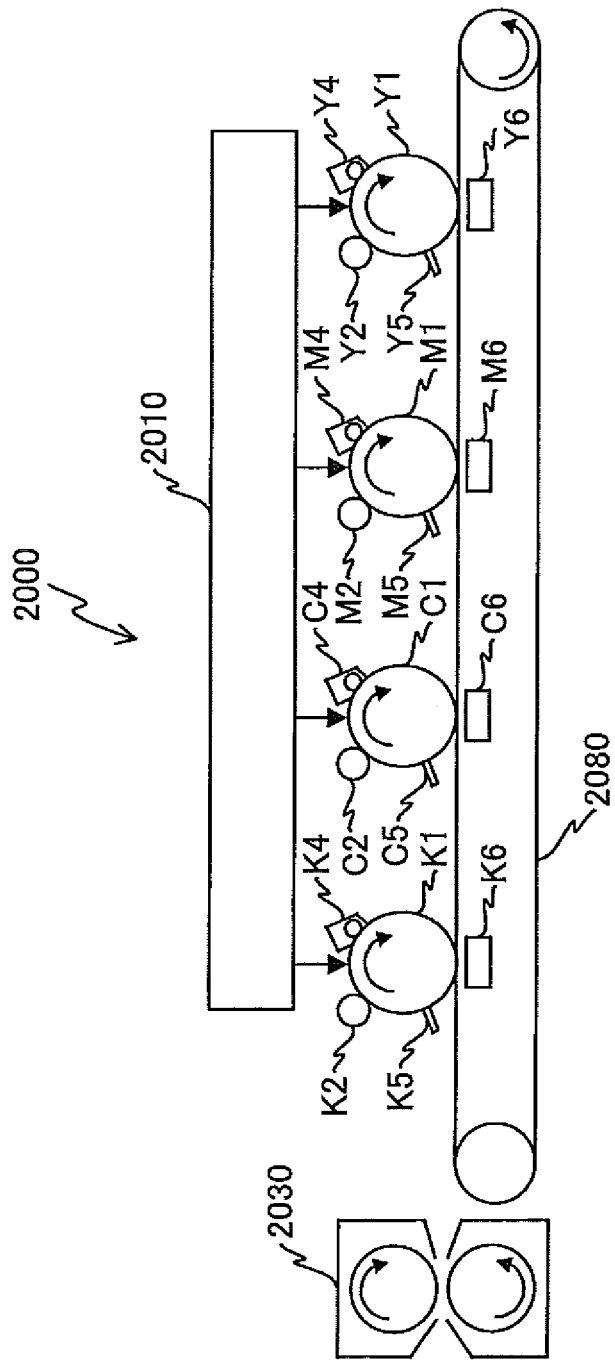
FIG. 38 is a cut-away side view of a color printer.
Figure 39:
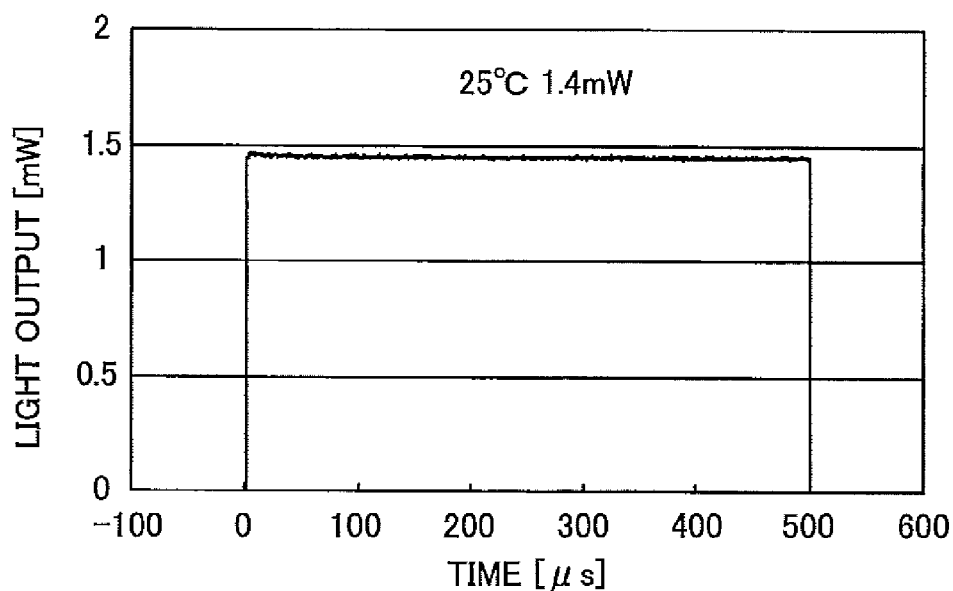
FIG. 39 is a graph showing a light pulse shape of a conventional surface emitting laser element.
Figure 40:
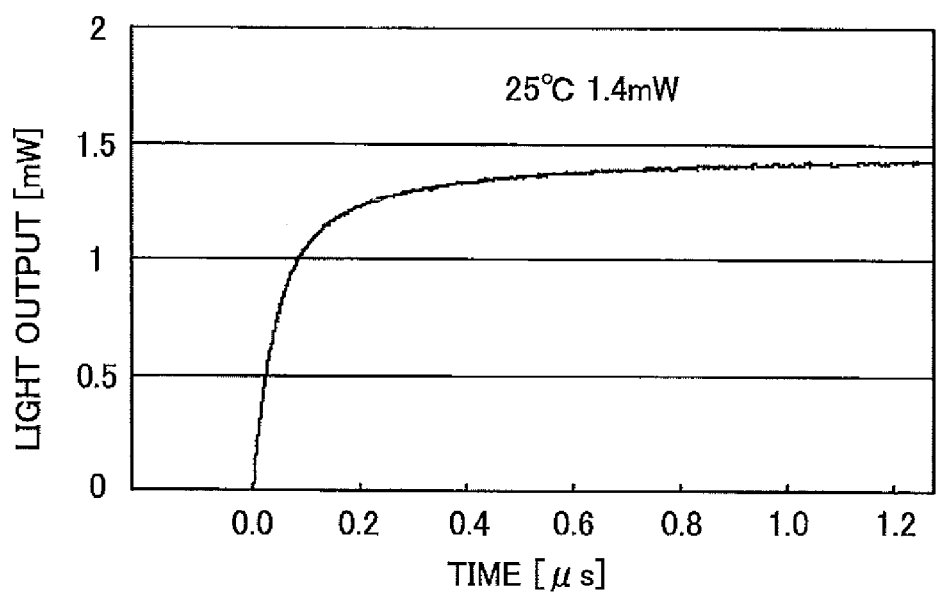
FIG. 40 is an enlarged view of a rise part of a light output shown in FIG. 39.

In addition, as shown in FIG. 38, as the image forming apparatus, a color printer 2000 having plural photoconductor drums can be used.

The color printer 2000 is a tandem type multiple color printer which forms a full color image by superposing four color images (black, cyan, magenta, and yellow images). The color printer 2000 includes a photoconductor drum K1, a charging device K2, a developing device K4, a cleaning unit K5, and a transfer device K6 for a black image; a photoconductor drum C1, a charging device C2, a developing device C4, a cleaning unit C5, and a transfer device C6 for a cyan image; a photoconductor drum M1, a charging device M2, a developing device M4, a cleaning unit M5, and a transfer device M6 for a magenta image; a photoconductor drum Y1, a charging device Y2, a developing device Y4, a cleaning unit Y5, and a transfer device Y6 for a yellow image; an optical scanning device 2010, a transfer belt 2080, and a fixing unit 2030.

In the following, since the operations of the elements are the same in the four color images, the operations of the black image are described as representative.

The photoconductor drum K1 is rotated in the arrow direction shown in FIG. 38. The charging device K2, the developing device K4, the cleaning unit K5, and the transfer device K6 are disposed to surround the photoconductor drum K1. The charging device K2 uniformly charges the surface of the photoconductor drum K1. The optical scanning device 2010 radiates light beams onto the surface of the photoconductor drum K1 charged by the charging device K2. With this, an electrostatic latent image is formed on the surface of the photoconductor drum K1. The developing device K4 develops the electrostatic latent image and forms a toner image on the surface of the photoconductor drum K1. The transfer device K6 transfers the toner image onto a recording medium (paper) on a transfer belt 2080, and the transferred image is fixed by the fixing unit 2030. When the above operations are performed for all color images, a full color image is printed on the recording medium.

The optical scanning device 2010 includes a light source similar to the light source 14 in each color. Therefore, the optical scanning device 2010 can obtain the same effects as those of the optical scanning device 1010. In addition, since the color printer 2000 includes the optical scanning device 2010, the color printer 2000 can obtain the same effects as those of the laser printer 1000.

In the color printer 2000, a color registration error may be generated due to a manufacturing error of each component and a positioning error of the component. However, since the optical scanning device 2010 includes plural light emitting sections two-dimensionally disposed, when a light emitting section to be lighted is selected, the color registration error can be accurately corrected.

As described above, according to the embodiments of the present invention, in the surface emitting laser element 100 (100A) and the surface emitting laser array 500, the negative droop characteristics can be sufficiently prevented. In addition, in the optical scanning device 1010, accurate optical scanning can be performed. In addition, the image forming apparatus 1000 can form a high quality image.

Further, the present invention is not limited to the embodiments, but various variations and modifications may be made without departing from the scope of the present invention.

The present invention is based on Japanese Priority Patent Application No. 2008-029877 filed on Feb. 12, 2008, Japanese Priority Patent Application No. 2008-112494 filed on Apr. 23, 2008, Japanese Priority Patent Application No. 2008-138419 filed on May 27, 2008, Japanese Priority Patent Application No. 2008-287101 filed on Nov. 7, 2008, and Japanese Priority Patent Application No. 2008-287123 filed on Nov. 7, 2008, with the Japanese Patent Office, the entire contents of which are hereby incorporated herein by reference.

The invention claimed is:

1. A surface emitting laser element which emits light in a direction perpendicular to a surface of a substrate of the surface emitting laser element, comprising:
    a resonator structural body including an active layer; and
    first and second semiconductor distributed Bragg reflectors which sandwich the resonator structural body and include a confinement structure which can confine an injection current and a lateral mode of oscillation light at the same time by surrounding a current passing through region with an oxide containing at least an oxide formed by oxidizing a part of a layer to be selectively oxidized containing aluminum; wherein
    a thickness of the layer to be selectively oxidized is at least 25 nm; and
    a temperature when an oscillation threshold current becomes a minimum value is 25 ° C. or less in a relationship between the temperature and the oscillation threshold current; and
wherein:
    when a rectangular current pulse whose pulse period is 1 ms and whose pulse width is 500 μs is supplied to the surface emitting laser element, a relationship of (P1−P2)/P2≥−0.1 is satisfied when a light output after 10 ns of the pulse being supplied is defined as P1 and a light output after 1 μs of the pulse being supplied is defined as P2.

2. The surface emitting laser element as claimed in claim 1, wherein:

when a width of the current passing through region is defined as "d" μm, and a thickness of the oxide surrounding the current passing through region is defined as "t" nm, a relationship of $(-2.54d^2-0.14t^2-0.998d \cdot t+53.4d+12.9t-216 \geq 0.9)$ is satisfied.

3. The surface emitting laser element as claimed in claim 1, wherein:
a part of plural semiconductor layers including the resonator structural body and the first and second semiconductor distributed Bragg reflectors has a mesa shape of a column shape or a quadrangular prism shape extending in a light emitting direction, and
the diameter of the column shape or the length of one side of the quadrangular prism shape in a cross section perpendicular to a light oscillation direction is at least 22 μm.

4. The surface emitting laser element as claimed in claim 1, wherein:
a doping concentration of an impurity in a region adjacent to the resonator structural body in the first semiconductor distributed Bragg reflector is relatively lower than the doping concentration of the impurity in other regions in the first semiconductor distributed Bragg reflector.

5. The surface emitting laser element as claimed in claim 1, wherein:
the first semiconductor distributed Bragg reflector includes plural pairs of a low refractive index layer and a high refractive index layer, and
the layer to be selectively oxidized is at a third pair or a fourth pair from the resonator structural body in the first semiconductor distributed Bragg reflector.

6. An optical scanning device which scans a surface to be scanned by light, comprising:
a light source which includes the surface emitting laser element as claimed in claim 1;
a deflector which deflects light from the light source; and
a scanning optical system which condenses light deflected by the deflector onto the surface to be scanned.

7. An image forming apparatus, comprising:
at least one image carrier; and
at least one of the optical scanning devices as claimed in claim 6 which scans light including image information onto the image carrier.

8. A surface emitting laser element which emits light in a direction perpendicular to a surface of a substrate of the surface emitting laser element, comprising:
a resonator structural body including an active layer; and
first and second semiconductor distributed Bragg reflectors which sandwich the resonator structural body and include a confinement structure which can confine an injection current and a lateral mode of oscillation light at the same time by surrounding current passing through region with an oxide containing at least an oxide formed by oxidizing a part of a layer to be selectively oxidized containing aluminum; wherein
a thickness of the layer to be selectively oxidized is at least 25 nm; and
a temperature when an oscillation threshold current becomes a minimum value is 25 ° C. or less in a relationship between the temperature and the oscillation threshold current; and ps wherein:
when only a temperature of a current injection region of the resonator structural body is changed from a room temperature to 60 ° C., a changing rate of a light confinement coefficient of a fundamental lateral mode in a lateral direction in the confinement structure is 10% or less.

9. A surface emitting laser element which emits light in a direction perpendicular to a surface of a substrate of the surface emitting laser element, comprising:
a resonator structural body including an active layer; and
first and second semiconductor distributed Bragg reflectors which sandwich the resonator structural body and include a confinement structure which can confine an injection current and a lateral mode of oscillation light at the same time by surrounding a current passing through region with an oxide containing at least an oxide formed by oxidizing a part of a layer to be selectively oxidized containing aluminum; wherein
a thickness of the layer to be selectively oxidized is at least 25 nm;
a maximum thickness of the oxide surrounding the current passing through region is 110 nm or less; and
a temperature when an oscillation threshold current becomes a minimum value is 25 ° C. or less in a relationship between the temperature and the oscillation threshold current; and
wherein:
when a rectangular current pulse whose pulse period is 1 ms and whose pulse width is 500 μs is supplied to the surface emitting laser element, a relationship of (P1 −P2)/P2≥−0.1 is satisfied when a light output after 10 ns of the pulse being supplied is defined as P1 and a light output after 1 μs of the pulse being supplied is defined as P2.

10. The surface emitting laser element as claimed in claim 9, wherein:
when a width of the current passing through region is defined as "d" μm, and a thickness of the oxide surrounding the current passing through region is defined as "t" nm, a relationship of $(-2.54d^2-0.14t^2-0.998d \cdot t+53.4d+12.9t-216 \geq 0.9)$ is satisfied.

11. The surface emitting laser element as claimed in claim 9, wherein:
the layer to be selectively oxidized is a part of low refractive index layers of the first semiconductor distributed Bragg reflector;
the low refractive index layer including the layer to be selectively oxidized includes a first layer adjacent to the layer to be selectively oxidized and a second layer adjacent to the first layer; and
a content rate of aluminum in the first layer is lower than the content rate of aluminum in the layer to be selectively oxidized, and is higher than the content rate of aluminum in the second layer.

12. The surface emitting laser element as claimed in claim 11, wherein:
an optical thickness of the low refractive index layer including the layer to be selectively oxidized is (2n+1) λ/4 (n is an integer of 1 or more) when an oscillation wavelength is defined as λ.

13. The surface emitting laser element as claimed in claim 11, wherein:
a difference between the content rate of aluminum in the layer to be selectively oxidized and the content rate of aluminum in the first layer is 5% or more and 20% or less.

14. The surface emitting laser element as claimed in claim 11, wherein:
a difference between the content rate of aluminum in the layer to be selectively oxidized and the content rate of aluminum in the second layer is more than 20%.

15. The surface emitting laser element as claimed in claim 9, wherein:

a gain peak wavelength in the oscillation threshold current at a room temperature is longer than a resonance wavelength in the resonator structural body.

16. An optical scanning device which scans a surface to be scanned by light, comprising:
- a light source which includes the surface emitting laser element as claimed in claim 9;
- a deflector which deflects light from the light source; and
- a scanning optical system which condenses light deflected by the deflector onto the surface to be scanned.

17. An image forming apparatus, comprising:
- at least one image carrier; and
- at least one of the optical scanning devices as claimed in claim 16 which scans light including image information onto the image carrier.

* * * * *